(12) United States Patent
Wesselman et al.

(10) Patent No.: US 7,645,941 B2
(45) Date of Patent: Jan. 12, 2010

(54) SHIELDED FLEXIBLE CIRCUITS AND METHODS FOR MANUFACTURING SAME

(75) Inventors: Dale J. Wesselman, Placentia, CA (US); Charles E. Tapscott, Anaheim Hills, CA (US)

(73) Assignee: Multi-Fineline Electronix, Inc., Anaheim, CA (US)

( * ) Notice: Subject to any disclaimer, the term of this patent is extended or adjusted under 35 U.S.C. 154(b) by 104 days.

(21) Appl. No.: 11/739,550

(22) Filed: Apr. 24, 2007

(65) Prior Publication Data

US 2008/0202807 A1 Aug. 28, 2008

Related U.S. Application Data

(60) Provisional application No. 60/811,927, filed on Jun. 8, 2006, provisional application No. 60/796,716, filed on May 2, 2006.

(51) Int. Cl.
*H05K 1/09* (2006.01)
(52) U.S. Cl. .......................... 174/251; 361/794; 29/850
(58) Field of Classification Search ................ 174/251; 361/794; 29/850
See application file for complete search history.

(56) References Cited

U.S. PATENT DOCUMENTS 3,372,358 A 3/1968 Roy et al.

(Continued)

FOREIGN PATENT DOCUMENTS

| CN | 193769 | 11/1992 |
|---|---|---|
| DE | 43 01 570 A | 7/1993 |
| DE | 196 39 881 A | 4/1998 |

(Continued)

OTHER PUBLICATIONS

Modular et al., "inductance of a Coil on a Thick Ferromagnetic Metal Plate", IEEE Transactions on Magnetics, vol. 34, No. 2, Mar. 1998, pp. 505-514.

*Primary Examiner*—Jeremy C Norris
(74) *Attorney, Agent, or Firm*—Knobbe, Martens, Olson & Bear, LLP

(57) ABSTRACT

A shielded flexible cable having a plurality of shielded electronic circuits in close proximity to one another such that signals transmitted on one of said plurality of shielded electronic circuits do not substantially interfere with signals transmitted on the other of said plurality of electronic circuits comprising a polyimide support member supporting a plurality of etched copper traces on a first side of said polyimide support member and a copper layer on a second side of said polyimide support member; said polyimide support member flexible along at least one axis; said plurality of etched copper traces and said copper layer substantially as flexible as said polyimide support member; a silver based material, including, for example, silver ink or silver film, surrounding a portion of each of said plurality of copper traces along substantially the entire length of each of said plurality of copper traces; said silver based material in electrical communication with (i) said copper layer via discontinuities in said polyimide support member, and (ii) a grounded terminal; an electrically insulative material in substantial proximity to each of said plurality of copper traces so as to electrically insulate each of said plurality of copper traces from (i) the other said plurality of copper traces, and (ii) said silver based material; said electrically insulative material physically located between said silver based material and each of said plurality of copper traces; a first dielectric layer covering substantially the entire exposed surface of said silver based material; and a second dielectric layer covering substantially the entire exposed surface of said copper layer.

38 Claims, 27 Drawing Sheets

U.S. PATENT DOCUMENTS

| | | |
|---|---|---|
| 3,583,066 A | 6/1971 | Carbonel |
| 3,684,991 A | 8/1972 | Trump et al. |
| 3,898,595 A | 8/1975 | Launt |
| 4,172,245 A | 10/1979 | Link |
| 4,253,231 A | 3/1981 | Nouet |
| 4,383,235 A | 5/1983 | Layton et al. |
| 4,547,705 A | 10/1985 | Hirayama et al. |
| 4,622,627 A | 11/1986 | Rodriguez et al. |
| 4,665,357 A | 5/1987 | Herbert |
| 4,800,461 A | 1/1989 | Dixon et al. |
| 4,901,048 A | 2/1990 | Williamson |
| 5,070,317 A | 12/1991 | Bhagat |
| 5,126,714 A | 6/1992 | Johnson |
| 5,177,460 A | 1/1993 | Dhyanchand et al. |
| 5,257,000 A | 10/1993 | Billings et al. |
| 5,300,911 A | 4/1994 | Walters |
| 5,392,020 A | 2/1995 | Chang |
| 5,481,238 A | 1/1996 | Carsten et al. |
| 5,487,214 A | 1/1996 | Walters |
| 5,514,337 A | 5/1996 | Groger et al. |
| 5,525,951 A | 6/1996 | Sunano et al. |
| 5,532,667 A | 7/1996 | Haertling et al. |
| 5,781,091 A | 7/1998 | Krone et al. |
| 5,802,702 A | 9/1998 | Fleming et al. |
| 5,877,669 A | 3/1999 | Choi |
| 5,884,990 A | 3/1999 | Burghartz et al. |
| 5,898,991 A | 5/1999 | Fougel et al. |
| 5,942,965 A | 8/1999 | Kitamura et al. |
| 5,959,846 A | 9/1999 | Noguchi et al. |
| 5,996,214 A | 12/1999 | Bell |
| 6,014,071 A | 1/2000 | Onishi et al. |
| 6,040,753 A | 3/2000 | Bicknell et al. |
| 6,073,339 A | 6/2000 | Levin |
| 6,148,500 A | 11/2000 | Krone et al. |
| 6,211,767 B1 | 4/2001 | Jitaru |
| 6,222,733 B1 | 4/2001 | Gammenthaler |
| 6,262,463 B1 | 7/2001 | Miu et al. |
| 6,270,375 B1 | 8/2001 | Cox et al. |
| 6,278,354 B1 | 8/2001 | Booth |
| 6,329,606 B1 | 12/2001 | Freyman et al. |
| 6,353,189 B1 * | 3/2002 | Shimada et al. ............. 174/255 |
| 6,383,033 B1 | 5/2002 | Politsky et al. |
| 6,593,836 B1 | 7/2003 | Lafleur et al. |
| 6,674,335 B1 | 1/2004 | Harding |
| 6,796,017 B2 | 9/2004 | Harding |
| 6,820,321 B2 | 11/2004 | Harding |
| 2004/0135662 A1 | 7/2004 | Harding |
| 2005/0034297 A1 | 2/2005 | Harding |
| 2005/0093672 A1 | 5/2005 | Harding |

FOREIGN PATENT DOCUMENTS

| | | |
|---|---|---|
| EP | 0 033 441 A | 8/1981 |
| EP | 0 262 329 A | 4/1988 |
| EP | 0 512 718 A | 11/1992 |
| EP | 0 756 298 A | 1/1997 |
| EP | 0 880 150 A | 11/1998 |
| EP | 0 936 639 A | 8/1999 |
| JP | 55-110009 | 8/1980 |
| JP | 03276604 | 12/1991 |
| JP | 07022241 | 1/1995 |
| JP | 09083104 | 3/1997 |
| JP | 09186041 | 7/1997 |
| JP | 10116746 A2 | 5/1998 |
| JP | 363228604 A | 9/1998 |
| JP | 11040915 | 2/1999 |
| JP | 11243016 | 9/1999 |
| JP | 11312619 | 11/1999 |
| JP | 2000182851 A2 | 6/2000 |
| TW | 432412 | 5/2001 |
| WO | WO 98/43258 | 10/1998 |
| WO | WO 02/32198 A2 | 4/2002 |
| WO | WO 02/32198 A3 | 4/2002 |
| WO | WO 2004/025671 A3 | 3/2004 |

* cited by examiner

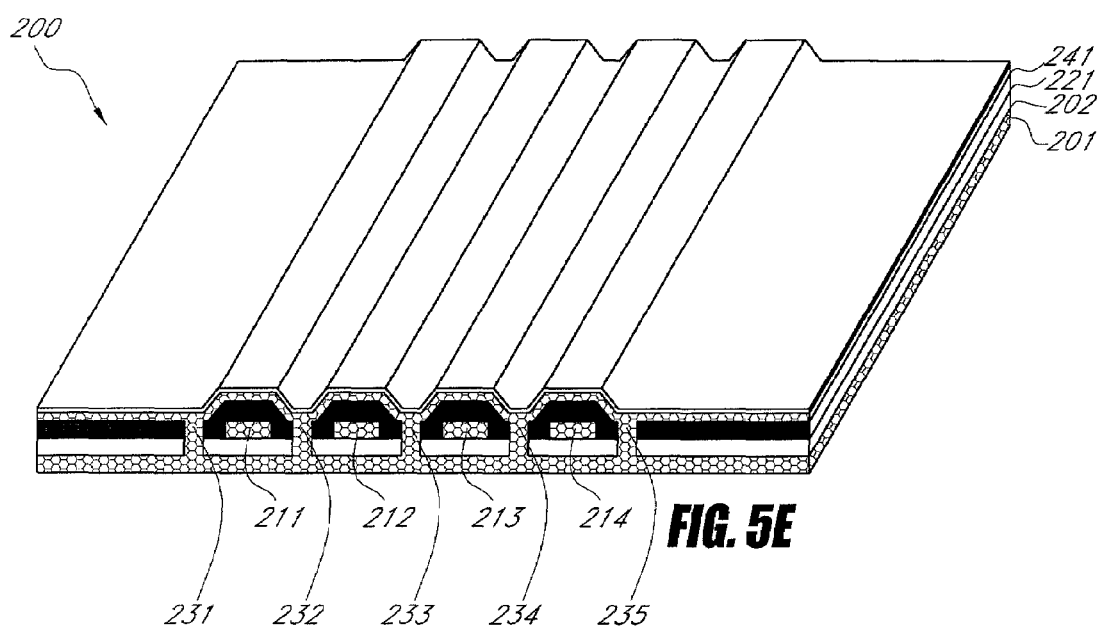

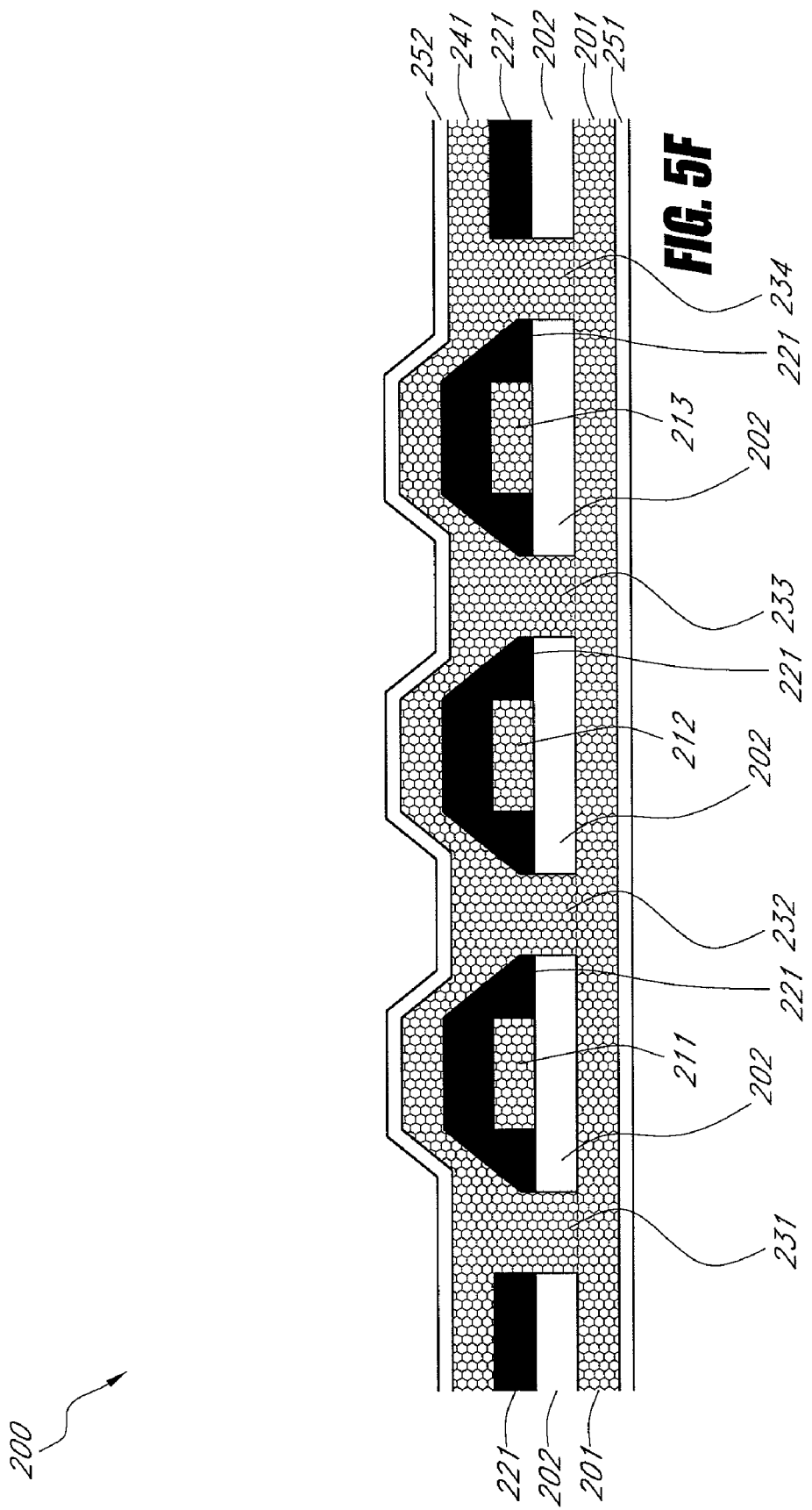

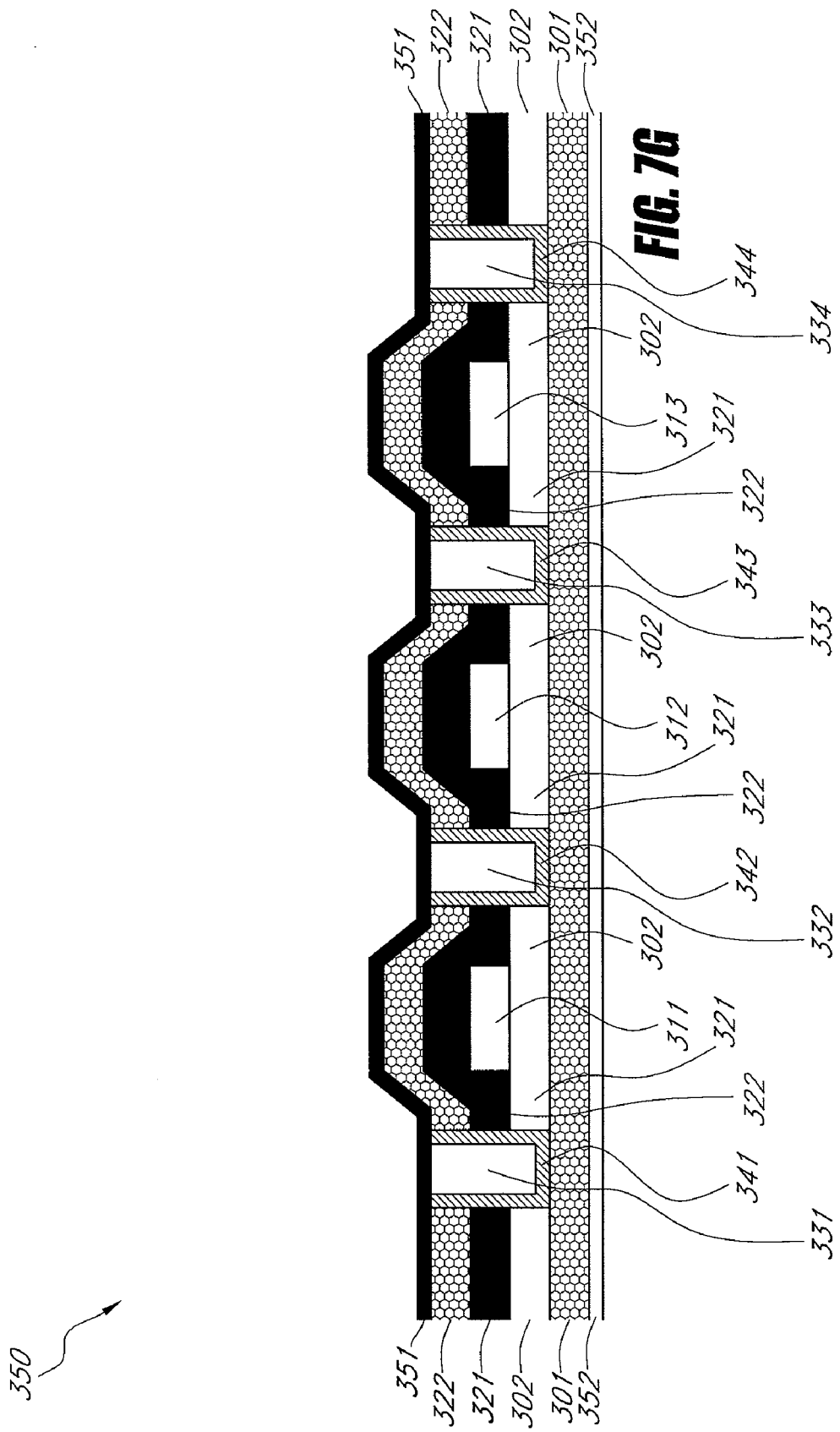

SHIELDED FLEXIBLE CIRCUITS AND METHODS FOR MANUFACTURING SAME

This application claims the benefit of (i) U.S. Provisional Application No. 60/796,716 filed May 2, 2006 and (ii) U.S. Provisional Application No. 60/811,927 filed Jun. 8, 2006. The entire contents of both Provisional Application No. 60/796,716 and Provisional Application No. 60/811,927 are expressly incorporated herein by reference.

FIELD OF THE INVENTION

This application relates generally to the field of flexible electronic circuits, and more particularly to methods and apparatuses for shielded electronic circuits supported on a flexible member.

BACKGROUND

The advent of mobile communication devices have permitted individuals to communicate with one another via wireless digital signal transmissions. Increasingly, individuals rely on mobile communication devices to also transfer data between one another via the World Wide Web (WWW), computers, computer networks and so forth. Individuals use mobile communication devices to transfer various types of data such as high quality digital audio, digital video, streaming digital video, photographic images, computer files and so forth. Accordingly, applications supporting this type of data transfer are congruous with the design of mobile communication devices, and such devices include, for example, mega-pixel cameras, video cameras, and digital audio recorders. Moreover, many commercially available cellular phones and personal digital assistant devices are capable of running typical computer-based application programs that create, utilize, and communicate large data files. As a result, there is a need in the art for mobile communication devices to transfer large amounts of data at high rates.

Many electronic devices, including mobile communication devices, generate electromagnetic fields in the radio frequency spectrum. Specifically, the transmission of electrical signals along a conductive path generates electromagnetic fields. As transmission frequencies increase, the magnitude and effective spatial reach of corresponding electromagnetic fields also increase. When two physically unconnected conductive paths are in close proximity to one another, a high frequency transmission on one of the conductive paths may result in electromagnetic interference (EMI) with respect to the transmission on the other conductive path. EMI has many deleterious effects on the operation of mobile communication devices. For example, EMI may cause the distortion of transmitted data and even the complete loss of data.

Due to higher data rates, mobile communication devices increasingly require conductors that are not susceptible to EMI. Specifically, flip phones, phones in which the screen is connected to the body of the phone via a rotating hinge, and slider phones, phones in which the screen is connected to the body of the phone via a laterally sliding mechanical connector, require flexible conductors to transmit data across the rotating hinge or mechanical connector. Thus, a need exists for flexible conductors capable of shielding against EMI generated during high-frequency transmissions.

One approach, well known in the prior art, for shielding against EMI are coaxial cables. Coaxial cables comprise a pair of conductors disposed around a common axis. A first conductor is positioned along the central axis of the cable and carries the transmitted signal. A second conductor, connected to an electrical ground, is cylindrically disposed around the first conductor by an insulative or dielectric material. By shielding the first conductor with the second conductor, a coaxial cable is able to confine the electromagnetic field generated by the conductor to an area inside the cable. Accordingly, coaxial cables are widely used for television and broadband transmission.

SUMMARY

The apparatuses and methods disclosed herein for a shielded flexible circuit advantageously enable high data transmission rates along closely spaced conductors on a flexible circuit. The apparatuses and methods are suitable for use in flip phones and slider phones. Additionally, they are capable of shielding conductive traces against EMI when data transmission rates exceed 1 GHz. As a result, in some embodiments, cell phones are able to transmit data at rates needed for streaming video and other high-rate applications without substantial signal loss or distortion. In further embodiments, shielded flexible circuits are capable of transmitting data at rates between 2 and 4 GHz.

In one embodiment, an apparatus comprises a flexible support member; a first conductor and a second conductor in contact with said flexible support member; said first and second conductors electrically insulated from the other; a first conductive material co-axially disposed around said first conductor, said first conductive material electrically insulated from said first conductor; and a second conductive material co-axially disposed around said second conductor, said second conductive material electrically insulated from said second conductor.

In another embodiment, a method of shielding a flexible circuit comprises forming a first conductor and a second conductor from a first conductive material adhered to a top side of a flexible support member, said first and second conductors electrically insulated from one another; forming a second conductive material co-axially disposed around said first conductor, said second conductive material electrically insulated from said first conductor; forming a third conductive material co-axially disposed around said second conductor, said third conductive material electrically insulated from said second conductor.

For purposes of this summary, certain aspects, advantages, and novel features of the invention are described herein. It is to be understood that not necessarily all such advantages may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

BRIEF DESCRIPTION OF THE DRAWINGS

FIG. 5E is a top perspective view of the flexible circuit of FIG. 5D with a conductive shielding layer on the top side in communication with a copper layer on a bottom side.

FIG. 5F is a cross-sectional view of the two copper layer shielded flexible circuit of FIG. 5E.

FIG. 7G is a cross-sectional view of the three layer shielded flexible circuit of FIG. 7F.

DETAILED DESCRIPTION

Figure 1A:
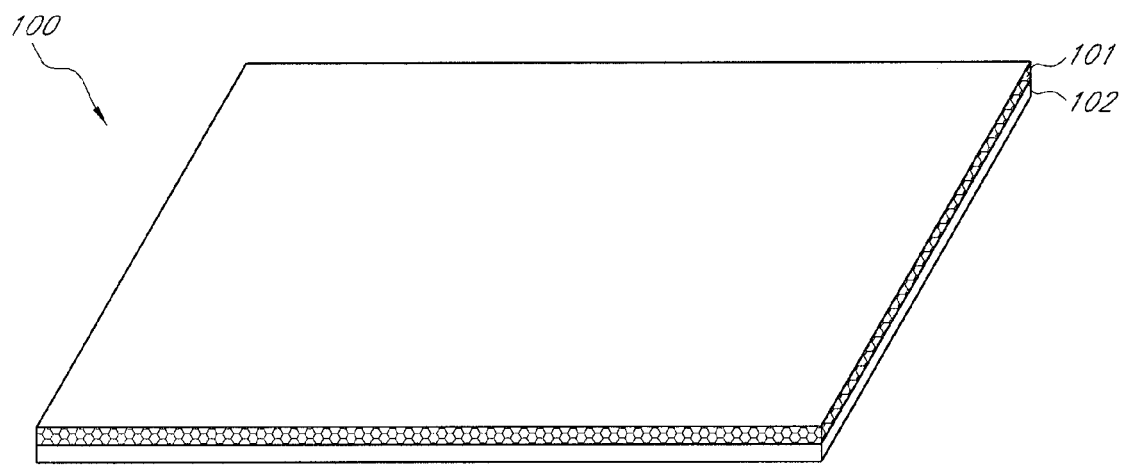
FIG. 1A is a top perspective view of one embodiment of a flexible circuit with one conductive layer.

Apparatuses and methods which represent various embodiments and an example application of an embodiment of the invention will now be described with reference to FIGS. 1-9. Variations to the apparatuses and methods which represent still other embodiments will also be described.

For purposes of illustration, some embodiments will be described in the context of a mobile communication device and/or mobile phones. The invention(s) disclosed herein are not limited by the context in which the apparatuses and methods are used, and that the apparatuses and methods may be used in other environments. Additionally, the specific implementations described herein are set forth in order to illustrate, and not to limit, the invention(s) disclosed herein. The scope of the invention(s) is defined only by the appended claims.

These and other features will now be described with reference to the drawings summarized above. The drawings and the associated descriptions are provided to illustrate embodiments of the invention(s) and not to limit the scope of the invention. Throughout the drawings, reference numbers may be re-used to indicate correspondence between referenced elements.

I. Overview

The apparatuses and methods disclosed herein pertain to shielding active signal traces on a flexible support member.

In one set of embodiments, a shielded flexible circuit is constructed using a base flexible material that comprises a flexible non-conductive substrate on a top side and a copper layer on a bottom side. In these embodiments, alternate traces are grounded to the copper layer and used to shield the traces between them. For ease of reference, embodiments of this type will hereinafter be referred to as a "Single-Copper Layer Shielding With Alternate Grounded Traces" embodiment.

In another set of embodiments, a shielded flexible circuit is constructed using a base material that comprises a flexible substrate on a top side and a copper layer on a bottom side. In these embodiments, substantially every trace may be used as an active signal trace. For ease of reference, embodiments of this type will hereinafter be referred to as a "Single Copper Layer With All Traces Shielded" embodiment.

In yet another set of embodiments, a shielded flexible circuit is constructed using a base material that comprises a flexible substrate with a copper layer on a top side and a copper layer on a bottom side of the flexible substrate. For ease of reference, embodiments of this type will hereinafter be referred to as a "Two Copper Layer" embodiment.

In a further set of embodiments, a shielded flexible circuit is constructed using a base material that comprises a flexible substrate with a copper layer on a top side and a copper layer on a bottom side of the flexible substrate. In these embodiments, copper may be used to shield the copper traces on all sides. For ease of reference, embodiments of this type will hereinafter be referred to as a "Three Copper Layer" embodiment.

Additionally, terms such as "above," "below," "top," and "bottom" are used throughout the specification. These terms should not be construed as limiting. Rather, these terms are used relative to the orientations of the applicable figures.

Moreover, the "process diagrams" are each illustrative of one embodiment of the invention(s) only. The invention(s) disclosed herein should not be limited to the steps of the process diagrams in the order that they appear. It is recognized that the steps may be performed in any order that is recognized as suitable by one with ordinary skill in the art.

II. Single Copper Layer Shielding With Alternate Grounded Traces Embodiments FIG. 1H illustrates one embodiment of a single copper layer shielding with alternate grounded traces. FIG. 2 illustrates a process diagram, including steps 501-508, for manufacturing a shielded flexible circuit, and FIGS. 1A-H illustrate the structure of the shielded flexible circuit as each step of the method is practiced. As described herein, the figures associated with the structure of the circuit at each step of the method will be expressly referenced. In contrast, each step of the method of FIG. 2 will be referred to using the reference numbers of FIG. 2 only.

Figure 2:
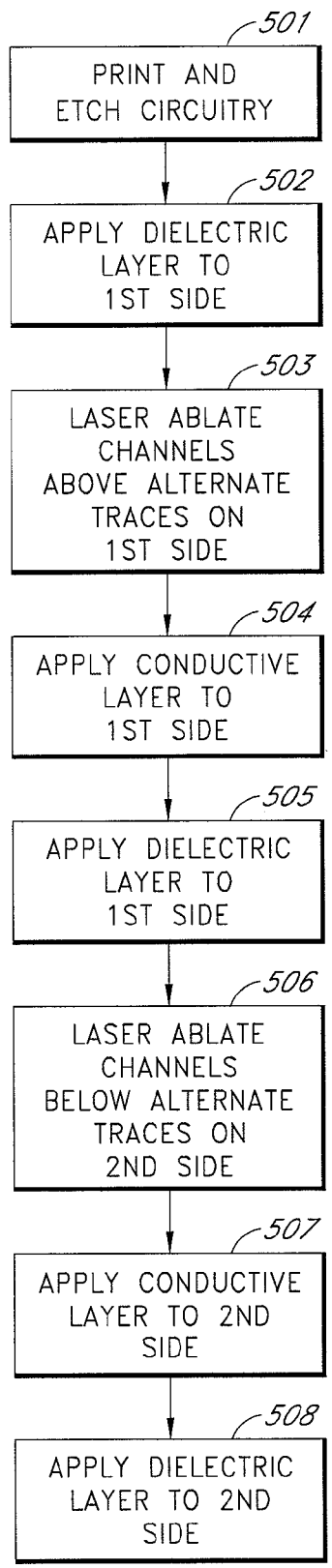
FIG. 2 is a process diagram illustrating one embodiment of a method for manufacturing the single copper layer shielded flexible circuit of FIG. 1H with alternate grounded traces.

In this embodiment, the method for manufacturing a shielded flexible circuit begins with the flexible support member 100 illustrated in FIG. 1A. The flexible support member 100 is comprised of two layers, a flexible substrate 102 and a base conductive layer 101. It is known to one with ordinary skill in the art that the flexible support member 100 is commercially manufactured and readily available for purchase. In other embodiments, the method may begin by applying the base conductive layer 101 to the flexible substrate 102 using plating, lamination, vapor deposition or other known techniques.

In one preferred embodiment, the flexible substrate 102 is made of a polyimide material. In other embodiments, the flexible substrate 102 may be any of the commonly used "Flex" or printed circuit board ("PCB") materials such as FR4, PET/PEN, Teflon/High speed materials, and so forth.

In one preferred embodiment, the base conductive layer 101 is a copper layer. In other embodiments, the base conductive layer 101 may be any electrically conductive material such as gold or silver. Though it is contemplated that other materials may be used, the base conductive layer 101 will be referred to herein as a copper base conductive layer 101.

Traditional PCB manufacturing methods may be used to create tooling holes or vias in the flexible support member 100.

Figure 1B:
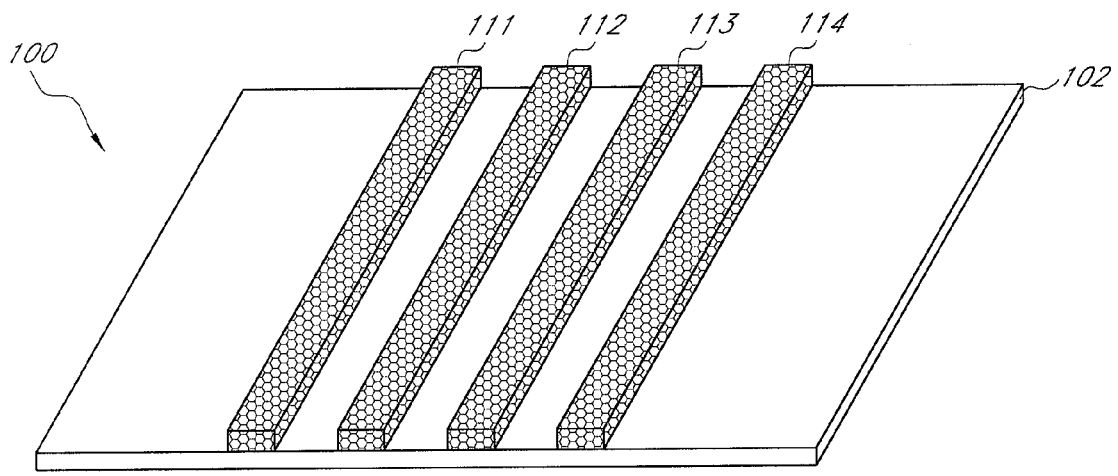
FIG. 1B is a top perspective view of the flexible circuit of FIG. 1A with etched traces.

FIG. 1B illustrates the copper traces 111, 112, 113, 114 formed after completion of step 501. In one embodiment, the copper traces 111, 112, 113, 114 are printed and etched using photolithography techniques well known to those skilled in the art. One photolithography technique requires laminating a dry film etch resist to the base conductive layer 101 using a hot roll laminator or a vacuum lamination process. Many dry film etch resist layers are commercially available and are produced by companies such as Dupont®. In some embodiments, the thickness of the dry film etch resist layer is between 0.0007" to 0.0020". A circuit image is then transferred to the etch resist layer using Ultraviolet ("UV") energy and an appropriate tool such as a photo tool, a Mylar® film, or a Mylar® glass. The areas of etch resist which were not exposed to UV energy are then chemically washed off of the panel. For example, a solution containing Potassium Carbonate may be used to wash off the undeveloped (that is, not exposed to UV energy) etch resist. Next, the copper which is exposed through the developed etch resist is chemically removed. For example, an aqueous wash of cupric chloride etchant may be used to remove the copper. Alternatively, other types of copper etchants may be used, such as alkaline-based etchants and ferric chloride-based etchants.

Figure 1C:
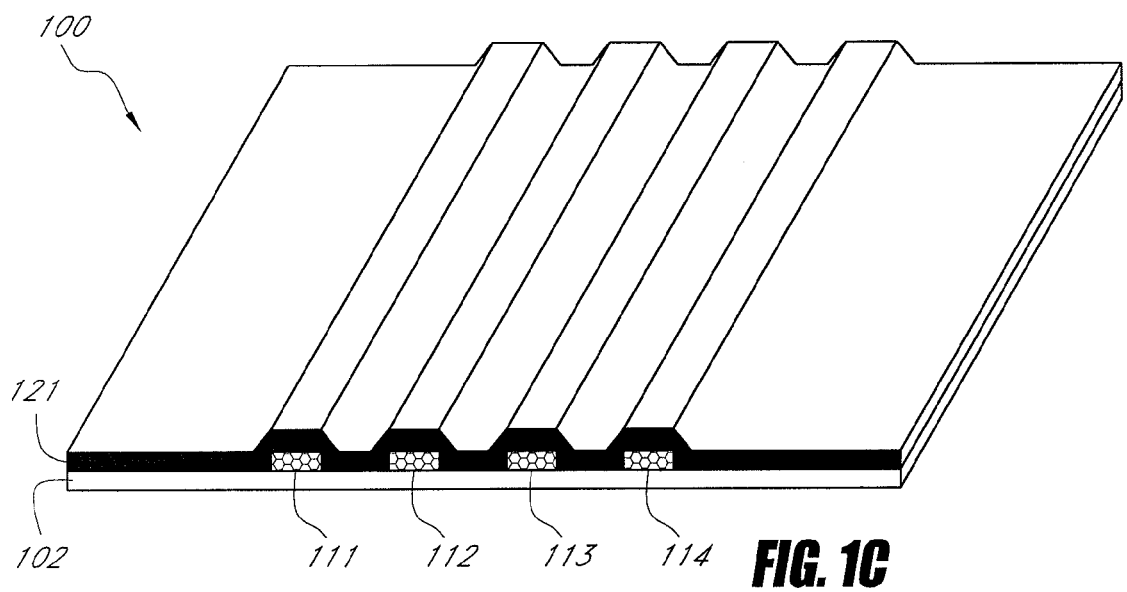
FIG. 1C is a top perspective view of the flexible circuit of FIG. 1B with a dielectric layer insulating the etched traces.

FIG. 1C illustrates the insulative or dielectric layer 121 applied to the top side of the flexible circuit 100 with the traces 111, 112, 113, 114. This layer is formed by step 502 to insulate the etched traces 111, 112, 113, 114 from the grounded shielding that is created later in the method so as to prevent an electrical short and to protect the traces 111, 112, 113, 114 from contamination. Any number of dielectric or non-conductive insulative materials may be used. For example, in one embodiment the dielectric layer 121 is comprised of a polyimide film with a thermal set adhesive on one side of the film. In this example, the polyimide film may range in thickness from 0.0005" to 0.0010", and the thermal set adhesive may range in thickness from 0.0005" to 0.0015". The film 121 is placed on top of the etched traces 111, 112, 113, 114 with the adhesive layer contacting the etched traces 111, 112, 113, 114. Then, using an autoclave or a vacuum press, the film is laminated to the flexible circuit 100. For example, lamination parameters such as 210 psi at 385 degrees Fahrenheit for 60 minutes may be used. It is recognized that other known techniques may be used to adhere the dielectric layer 121 to the flexible circuit 100.

Figure 1D:
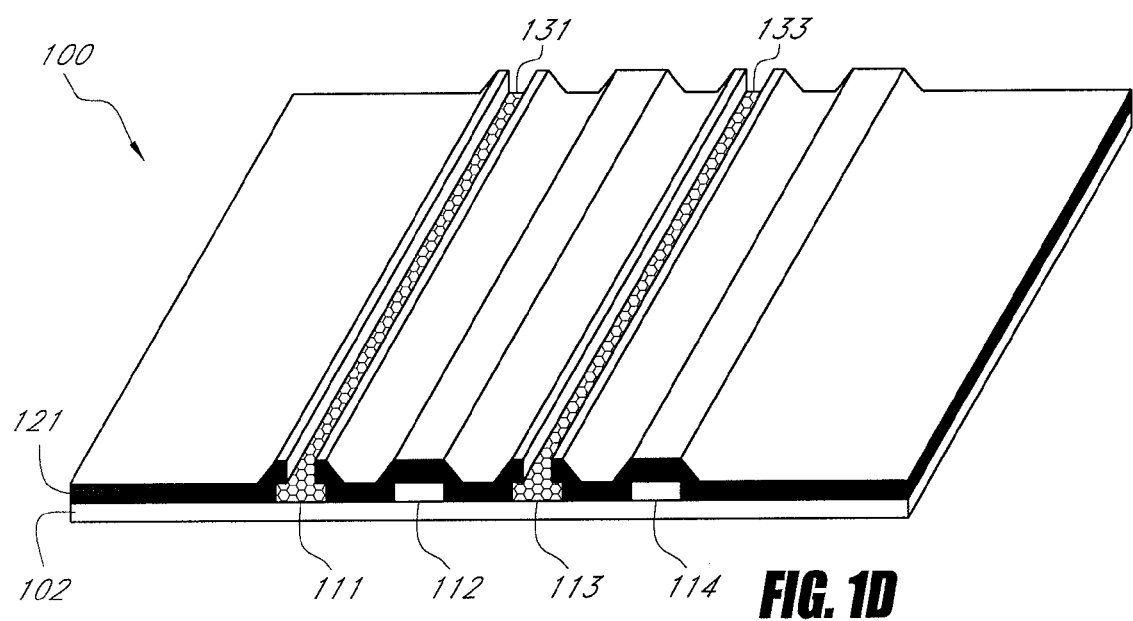
FIG. 1D is a top perspective view of the flexible circuit of FIG. 1C with channels exposing alternate grounded traces on a top side of the flexible circuit.

FIG. 1D illustrates the channels 131, 133 in the dielectric layer 121 created by step 503. The channels 131, 133 are created in locations corresponding to alternate traces 111, 113 and form discontinuities that will later form the shielding for the trace(s) 112 between them. The channels 131, 133 expose the alternate grounded traces 111, 113 along the length of each trace by removing the dielectric layer 121 above them. In one embodiment, the channels are created using laser ablation techniques. In other embodiments, other processing techniques, such as plasma etching and chemical milling, may be used.

It is recognized that in other embodiments, that channels may be created in locations corresponding to more or less than every other trace. In these embodiments, the traces between the created channels are shielded.

Next, in some embodiments, the exposed alternate grounded traces 111, 113 are metalized to protect the traces 111, 113 from oxidation. For example, a Nickel and Gold compound may be used to metalize the traces 111, 113.

Figure 1E:
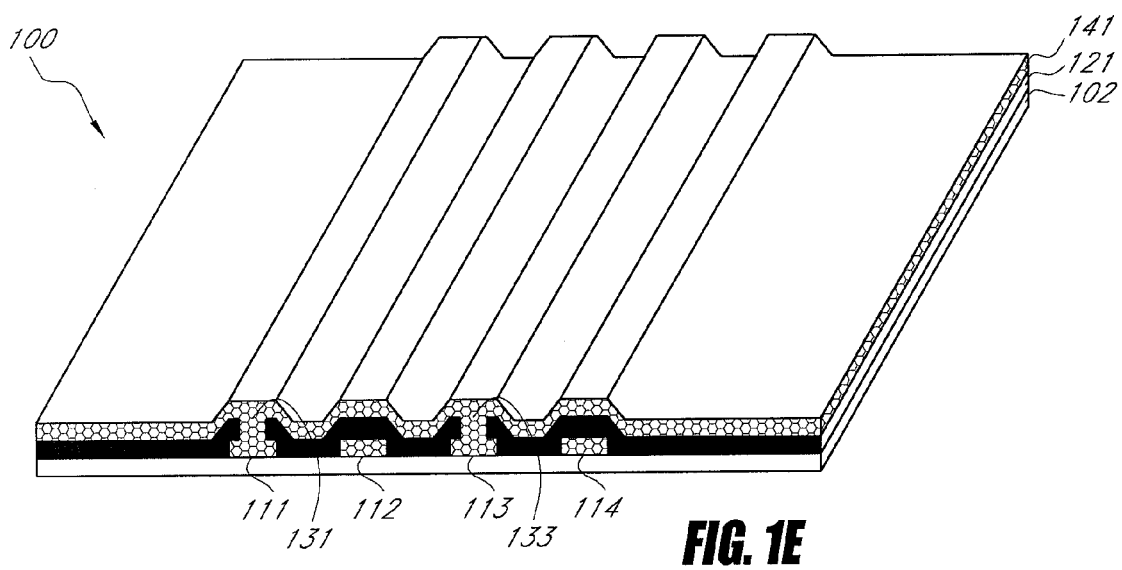
FIG. 1E is a top perspective view of the flexible circuit of FIG. 1D with a conductive shielding layer on the top side in communication with the alternate grounded traces.
Figure 1F:
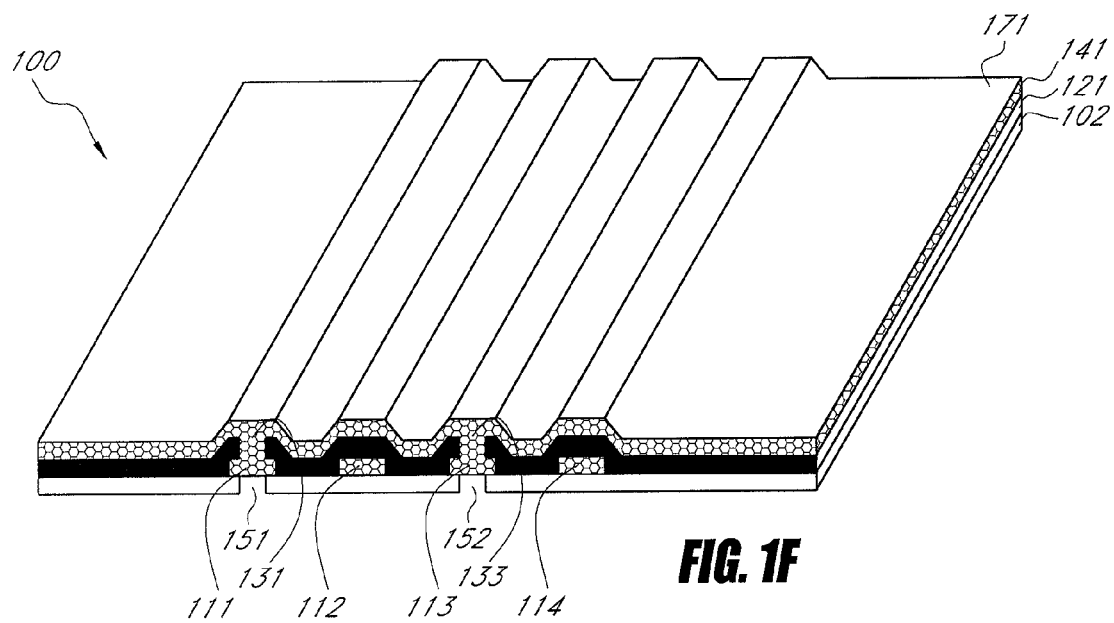
FIG. 1F is a top perspective view of the flexible circuit of FIG. 1E with channels exposing the alternate grounded traces on a bottom side of the flexible circuit.

FIGS. 1E and 1F illustrate a conductive shielding layer 141 and a dielectric layer 171 formed on the top side of the flexible circuit 100 by steps 504 and 505. The conductive layer 141 is applied to the flexible circuit 100 such that it is in electrical communication with the alternate grounded traces 111, 113. The conductive layer 141 may be comprised of any conductive material capable of adhering to the alternate grounded traces 111, 113 and the dielectric layer 121. Suitable conductive layer 141 materials include, but are not limited to, a silver based film and silver ink. The conductive layer 141 may be applied to the flexible circuit 100 using techniques similar to those used for adhering the dielectric layer 121 to the flexible circuit 100 (for example, lamination). Next, a dielectric layer 171 is applied to the flexible circuit 100 such that it is on top of the conductive layer 141. Techniques such as lamination may be used to adhere the dielectric layer 171 to the conductive layer 141. A suitable dielectric layer 171 material includes, but is not limited to, the material used for dielectric layer 121.

It is contemplated that the conductive layer 141 and the dielectric layer 171 may be adhered to the flexible circuit 100 separately, as described above, or concurrently (that is, steps 504 and 505 may be performed as one step). In one embodiment, concurrent application of the conductive layer 141 and the dielectric layer 171 may be performed using a pre-made material comprising a conductive layer and a dielectric layer. Examples of such materials can be found in Tatsuta's® PC series of materials. These materials comprise a conductive layer of silver foil, sandwiched between a conductive adhesive layer and a dielectric layer. The material is placed on the flexible circuit 100 such that the conductive adhesive is in contact with the dielectric layer 121. Then, the material may be laminated or otherwise adhered to the flexible circuit 100.

FIG. 1F illustrates channels 151, 152 formed by step 506 in the flexible substrate 102, on the bottom side of the flexible circuit 100, below the alternate grounded traces 111, 113. The channels 151, 152 may be created using techniques similar to those employed in step 503 (for example, laser ablation). In one embodiment, the channels are created in the flexible substrate 102 such that the alternate grounded traces 111, 113 are exposed along the length of the trace. Next, in some embodiments, the exposed copper traces 111, 113 are metalized using a Nickel/Gold compound in order to prevent oxidation.

Figure 1G:
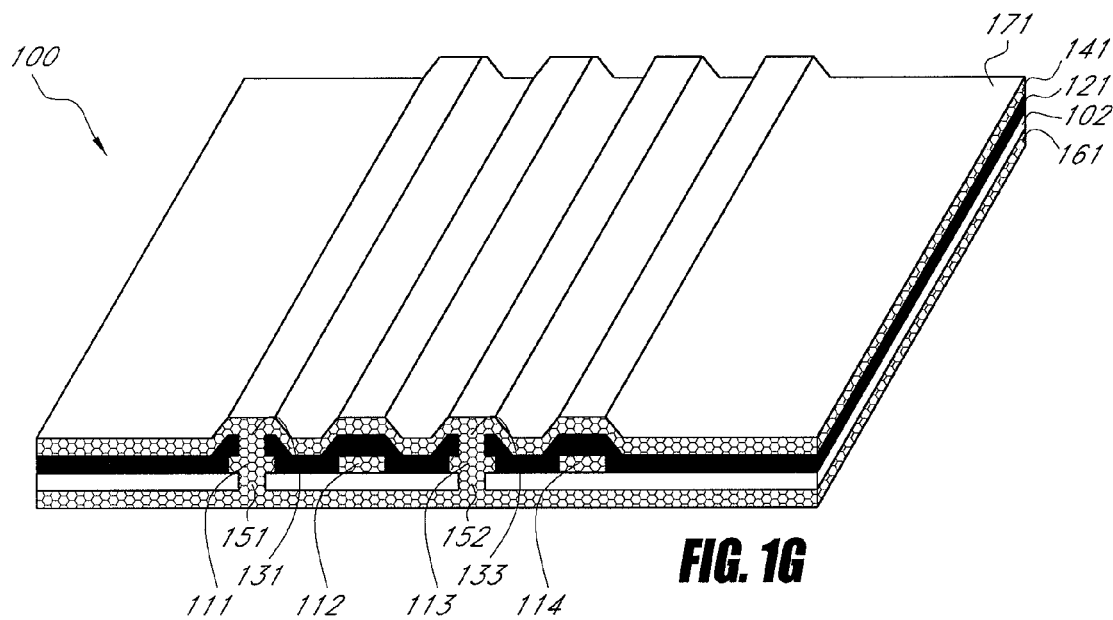
FIG. 1G is a top perspective view of the flexible circuit of FIG. 1F with a conductive shielding layer on the bottom side in communication with the alternate grounded traces.
Figure 1H:
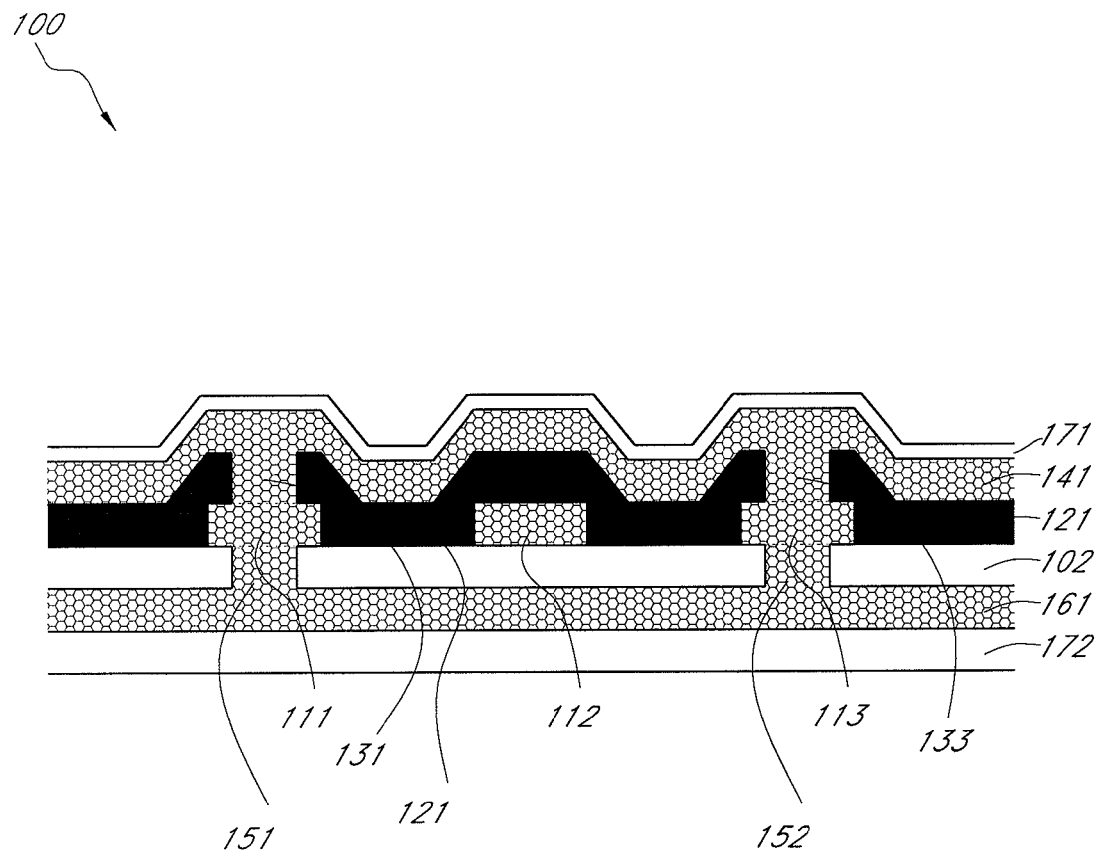
FIG. 1H is a cross-sectional view of the single copper layer shielded flexible circuit of FIG. 1G with alternate grounded traces.

FIG. 1G illustrates the conductive shielding layer 161 applied by step 507 to the side of the flexible circuit 100 below the flexible substrate 102. This conductive shielding layer 161 is applied such that it is in electrical communication with the alternate grounded traces 111, 113. As stated above with respect to step 508, the conductive shielding layer 161 may be laminated to the flexible circuit 100 and further, may be comprised of any conductive material such as copper or silver.

FIG. 1H illustrates a dielectric layer 172 applied by step 508 to the conductive shielding layer 161. This dielectric layer 172 shields the exposed conductive shielding layer from electrical interference and contamination. The dielectric layer 172 may be adhered to the flexible circuit 100 using techniques such as lamination and may be comprised of materials similar to those used in step 502 (for example, a polyimide film).

As stated with respect to steps 504 and 505, it is similarly contemplated that the conductive shielding layer 161 and the dielectric layer 172 may be applied to the flexible circuit 100 in one step using materials such as those included in the Tatsuta® PC series.

As shown in FIG. 1H, the center copper trace 112 is shielded on all sides. It is first shielded by non-conductive dielectric materials and then the non-conductive materials are surrounded by conductive materials. In particular, the trace 112 is electrically insulated from the ground plane 111, 113, 141 on the top and sides by dielectric layer 121 and electrically insulated from the ground plane 161 on the bottom by the flexible substrate 102. In this illustration, the conductive shielding comprises the conductive layer 141 on the top side of the trace 112, the conductive layer 161 on the bottom side of the trace 112, and the alternate grounded traces 111 and 113 on the sides of the trace 112.

Additionally, it is recognized that dielectric layers 171 and 172 are not required to shield the circuit from EMI. In some embodiments, neither or only one of the layers 171, 172 may be employed.

III. "Single Copper Layer With All Traces Shielded" Embodiments

Figure 3:
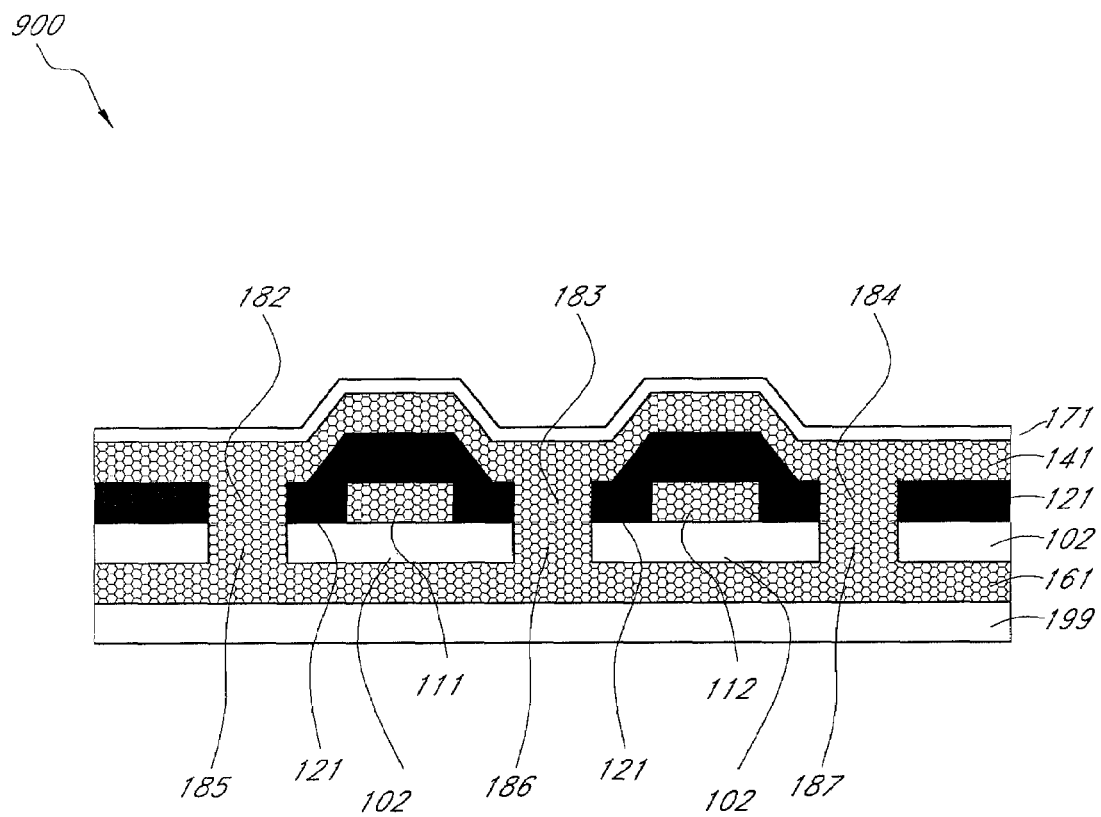
FIG. 3 is a cross-sectional view of one embodiment of a single copper layer flexible circuit with all traces shielded.
Figure 4:
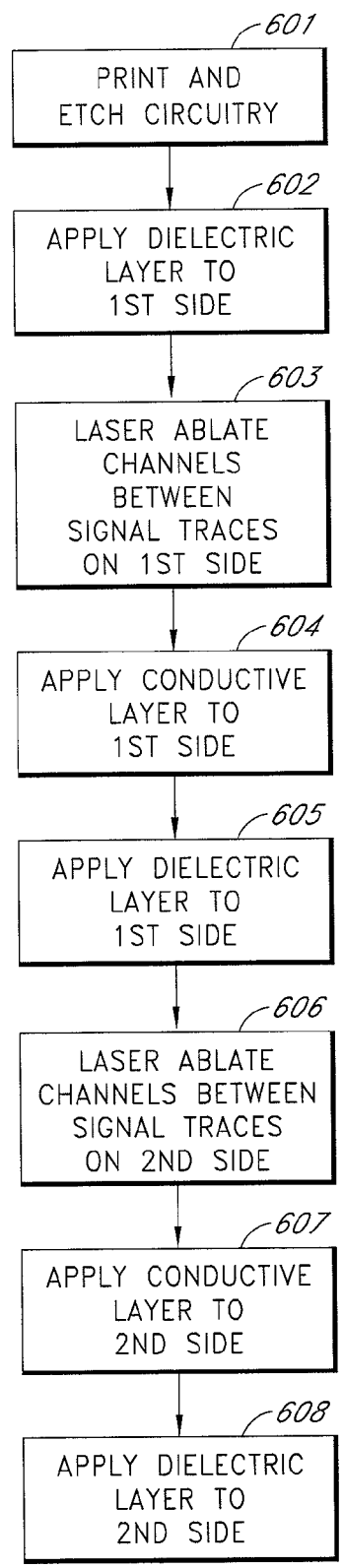
FIG. 4 is a process diagram illustrating one embodiment of the method for manufacturing a single copper layer flexible circuit of FIG. 3 with all traces shielded.

FIG. 3 illustrates one embodiment of a single copper layer with all traces shielded. FIG. 4 illustrates a process diagram, including steps 601-608, for one method of manufacturing the shielded flexible circuit 900 shown in FIG. 3. As described herein, the steps of the method of FIG. 4 will be referred to using the reference numbers provided in FIG. 4.

The apparatus and method for manufacturing the apparatus of FIGS. 3 and 4 share characteristics with the embodiment depicted in FIGS. 1A-H and FIG. 2. That is, many of the possible materials and techniques suggested and/or employed with respect the single copper layer shielding with alternate grounded traces embodiments may be used in connection with the single copper layer with all traces shielded embodiments. However, differences between the two sets of embodiments are noted below.

Moreover, the title given to the set of embodiments described in this section should not be construed as limiting. It is recognized that every trace 111, 112 need not be shielded. Rather, with these embodiments, it may be possible to shield every trace 111, 112.

In one embodiment, the method for manufacturing a shielded flexible circuit 900 begins with a flexible support member such as the member 100 depicted in FIG. 1A. Referring to FIGS. 3 and 4, active signal traces 111, 112 are formed from the base conductive layer 101 using print and etch techniques 601. A dielectric layer 121 is then applied to the top of the traces 111, 112 so as to electrically insulate the traces 111, 112 from the conductive portion of the shielding 141 that is applied in step 604.

Next, in step 603, channels 182, 183, 184 are created between the active signal traces 111, 112. The channels 182, 183, 184, may be created using laser ablation techniques to remove portions of the dielectric layer 121 located between the traces 111, 112. In the embodiment depicted in FIG. 3, the traces 111, 112 are not exposed to the channels.

Subsequently, a conductive shielded layer 141 is placed on top of the dielectric layer 121 and in the channels 182, 183, 184 in step 604. The conductive shielding layer 141 is adhered 604 to the top side of the flexible circuit 900 such that it is in contact with the flexible substrate 102. Next, an insulative layer 171 is adhered 605 to the top of the conductive shielding layer. It is recognized that in addition to performing steps 604 and 605 sequentially steps 604 and 605 may be performed as one step using a Tatsuta® PC series material.

A second set of channels 185, 186, 187 are created 606 on the bottom side of the flexible circuit 900. The channels 185, 186, 187 are located between the traces 111, 112 and positioned such that they expose the conductive shielding layer 141 located between the first set of channels 182, 183, 184. The second set of channels 185, 186, 187 may be created by employing laser ablation techniques to remove portions of the flexible substrate 102 in these locations.

A conductive shielded layer 161 is then adhered in step 607 to the bottom side of the flexible circuit 900 using, for example, lamination techniques. This conductive shielding layer 161 is applied in the channels 185, 186, 187 and is in electrical communication with conductive shielding layer 141. Next, a dielectric layer 199 may be adhered in step 608 to the conductive shielding layer 161 also using lamination techniques. As stated with respect to steps 604 and 605, it is recognized that steps 607 and 608 may be performed sequentially or as one step.

Additionally, in some embodiments, it is recognized that one or both dielectric layers 171 and 199 will not be employed to insulate conductive layers 141 and 161. The absence of the dielectric layers 171, 199 may not be required to shield the traces 111, 112 from EMI.

Moreover, it is recognized that in some embodiments, step 606 of the method, laser ablating channels 185, 186, 187 on the bottom side of the flexible circuit 900 may be omitted. Omitting step 606 requires that in step 603, laser ablation of channels 182, 183, 184 on the top side of the flexible support member, both the portions of the dielectric layer 121 and the polyimide layer 102 located between the traces 111, 112 be removed.

As shown in FIG. 3, the traces 111, 112 are each shielded in 360 degrees, first by a dielectric shielding and next by a conductive shielding. Each trace 111, 112 is insulated in all directions from the conductive shielding material and the other traces 111, 112. Dielectric layer 121 electrically insulates the top and sides of the traces 111, 112 from the ground plane 182, and the flexible substrate 102 electrically insulates the bottom of the traces 111, 112 from the ground plane 161. Accordingly, each trace 111, 112 is surrounded by grounded, conductive shielding materials. Conductive layer 141 provides conductive shielding on the top and sides of the traces 111, 112 and the bottom conductive layer 161 provides conductive shielding on the bottom of the traces 111, 112, 113.

IV. "Two Copper Layer" Embodiments

Figure 5A:
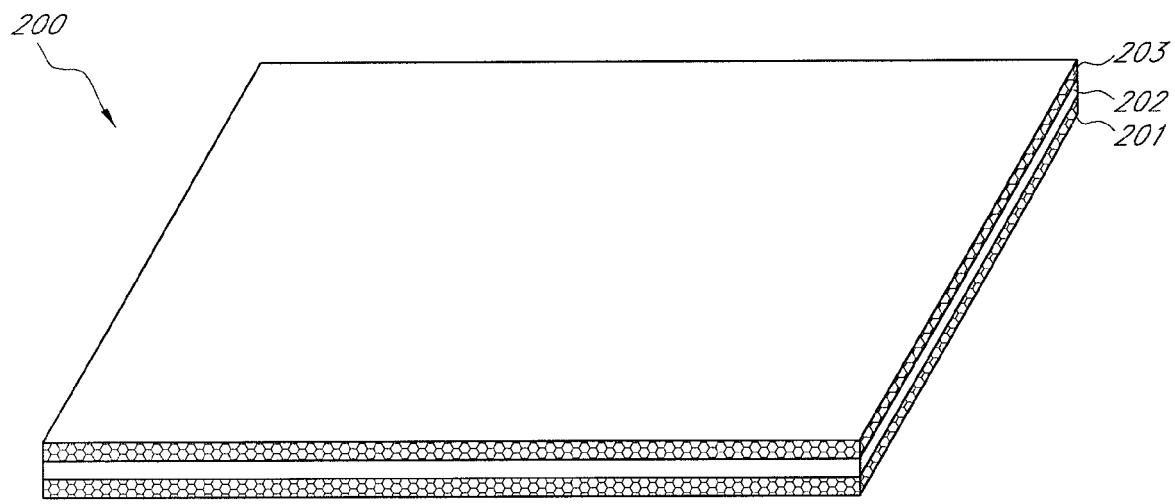
FIG. 5A is a top perspective view of one embodiment of a flexible circuit with two conductive layers.

FIG. 5F illustrates one embodiment of a two copper layer shielded flexible circuit. FIG. 6 illustrates a process diagram, including steps 701-706, for manufacturing the shielded flexible circuit of FIG. 5F, and FIGS. 5A-F illustrate the structure of the shielded flexible circuit as each step of the method is practiced. As described herein, the figures associated with the structure of the circuit at each step of the method will be expressly referenced. In contrast, each step of the process diagram of FIG. 6 will be referred to using the reference numbers of FIG. 6.

In embodiment depicted, the method for manufacturing a shielded flexible circuit begins with the flexible support member 200 illustrated in FIG. 5A. The flexible support member 200 is comprised of three layers, a flexible substrate 202 sandwiched between a top conductive layer 203 and a bottom conductive layer 201. It is known to one with ordinary skill in the art that flexible support member 200 is commercially manufactured and readily available for purchase. In other embodiments, the method may begin by applying the top and bottom base conductive layers 201, 203 to the flexible substrate 202 using plating, lamination, vapor deposition or other known techniques. Though the embodiments described herein are not limited to a top and bottom conductive layer 201, 203 comprised of copper, the embodiment depicted utilizes copper top and bottom conductive layers 201, 203.

Additionally, many alternate materials and techniques suggested with respect the single copper layer shielding with alternate grounded traces embodiments may be used in connection with the two copper layer embodiments. However, differences between the two sets of embodiments are noted below.

Figure 5B:
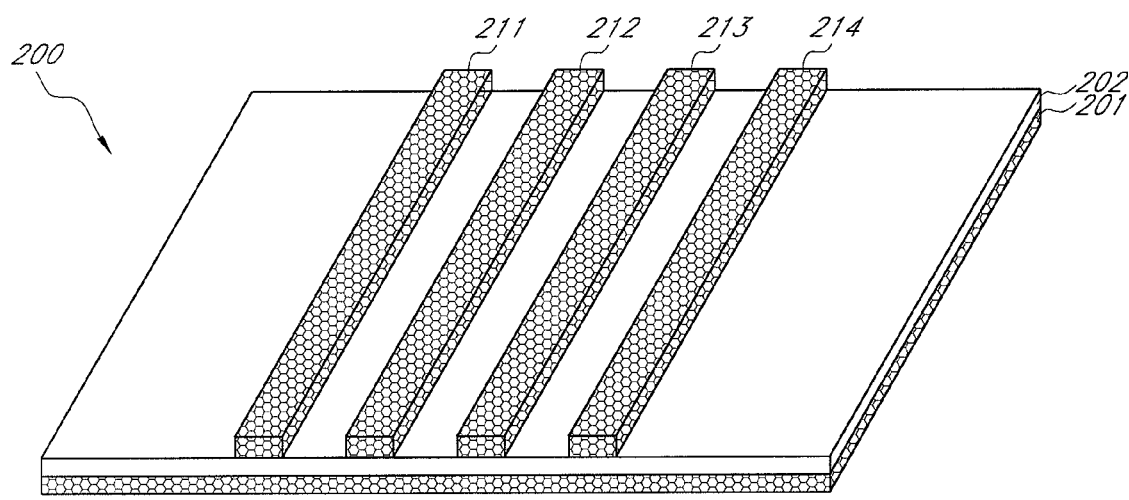
FIG. 5B is a top perspective view of the flexible circuit of FIG. 5A with etched traces.
Figure 6:
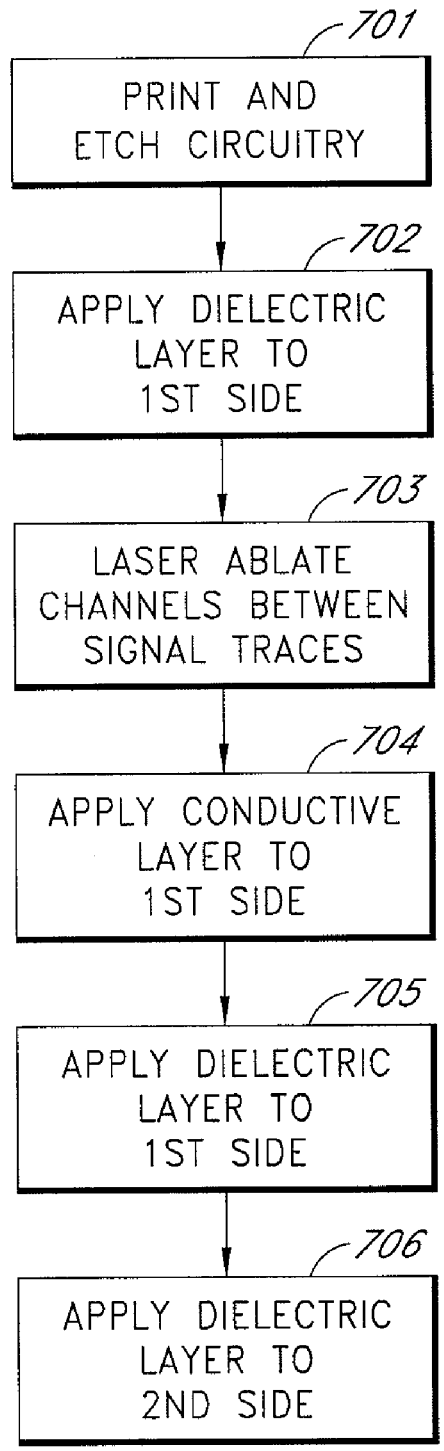
FIG. 6 is a process diagram illustrating one embodiment of a method for manufacturing the two copper layer shielded flexible circuit of FIG. 5F.

FIG. 5B illustrates the traces 211, 212, 213, 214 after they have been printed and etched in step 701 from the top copper layer 203. As shown, traces 211, 212, 213, 214 are not in electrical communication with one another because the design requirements of the illustrated embodiment requires that the traces 211, 212, 213, 214 be electrically isolated from one another.

Figure 5C:
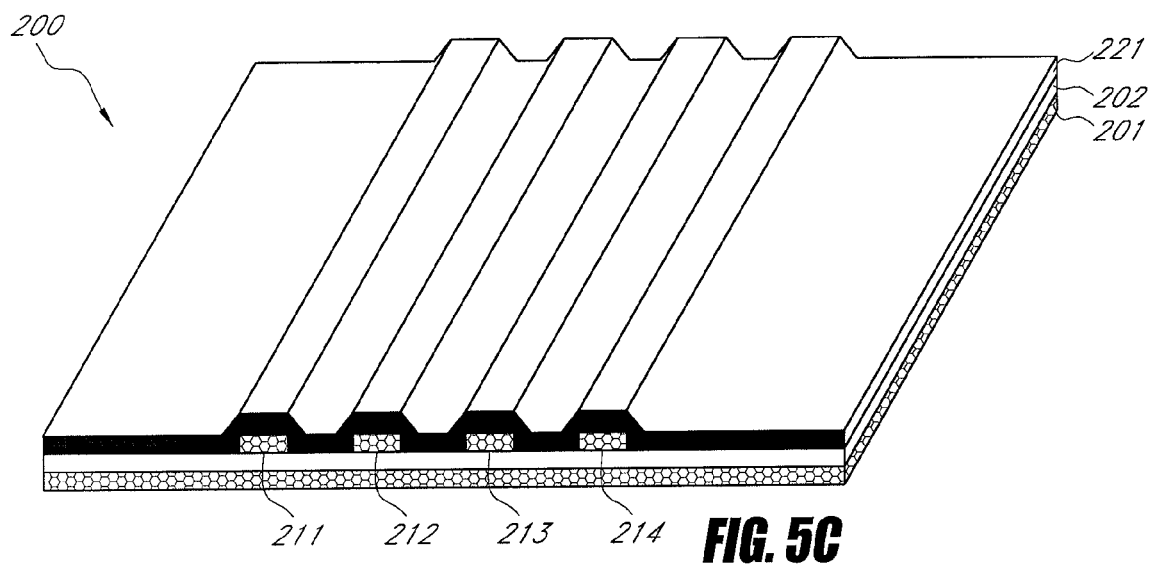
FIG. 5C is a top perspective view of the flexible circuit of FIG. 5B with a dielectric layer on a top side of the flexible circuit.

FIG. 5C illustrates an insulative or dielectric layer 221 applied in step 702 to the top side of the flexible circuit 200. Using, for example, lamination techniques, the dielectric layer 221 is adhered to the flexible substrate 202 and the traces 211, 212, 213, 214.

Figure 5D:
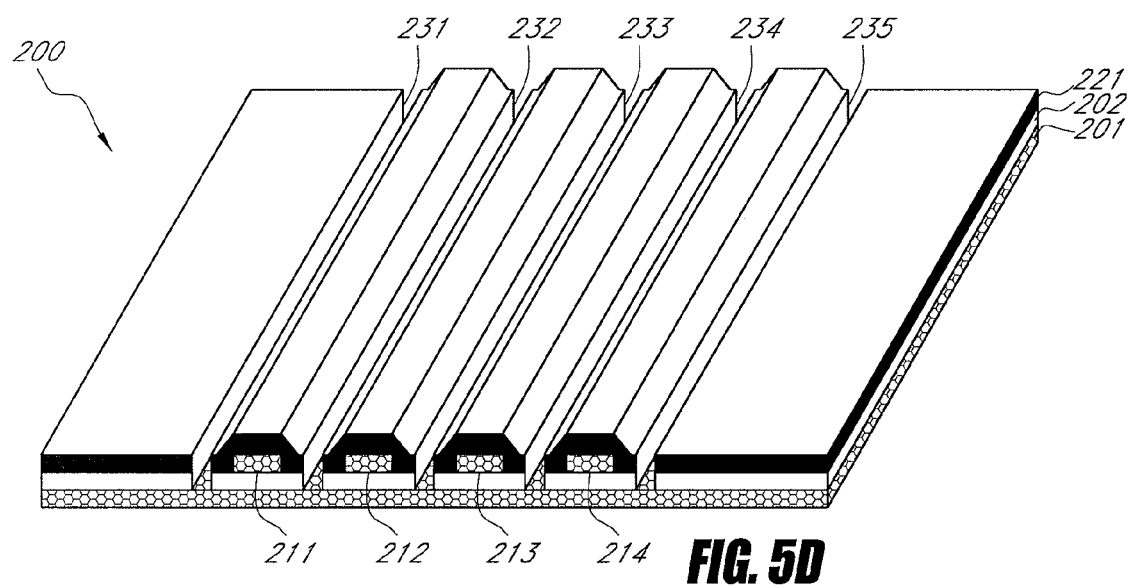
FIG. 5D is a top perspective view of the flexible circuit of FIG. 5C with channels between the etched traces on the top side.

FIG. 5D illustrates channels 231, 232, 233, 234 formed in step 703 between the active signal traces 211, 212, 213, 214. The channels 231, 232, 233, 234 are created by employing laser ablation or other known techniques to remove portions of the dielectric layer 221 and the flexible substrate 202 located between the traces 211, 212, 213, 214. As shown, the channels 231, 232, 233, 234 expose the top portion of the bottom copper layer 201 but do not expose the traces 211, 212, 213, 214 (that is, the traces 211, 212, 213, 214 remain insulated).

FIG. 5E illustrates a conductive shielded layer 241 applied in step 704 to the top side of the flexible circuit 200. The conductive shielding layer 241 is applied to the flexible circuit 240 such that it is in the channels 231, 232, 233, 234 and is in electrical communication with the bottom conductive layer 201. In one embodiment, the conductive shielding layer 241 is a silver filled ink. Dupont's® CB208 product is a silver ink that is commercially available and known to those skilled in the art. Typically, the silver ink is screen printed onto the surface of the dielectric layer 221 that was previously laser processed to expose the bottom conductive layer 201. In other embodiments, other conductive materials with the requisite flow characteristics may be used.

FIG. 5F illustrates insulative or dielectric layers 251, 252 applied in steps 705 and 706 to the top and bottom sides of the flexible circuit 200. In some embodiments, a dielectric film 251, 252 is laminated to the flexible circuit 200. The dielectric layers 251, 252 may serve to protect the flexible circuit 250 from external shorting.

In other embodiments, step 704 is carried out by laminating or otherwise adhering a conductive film to the dielectric layer and the channels 231, 232, 233, 234. In these embodiments, an insulative layer 252 may be then adhered to the top of the conductive shielding layer 251 in order to prevent external shorting. Alternatively, the conductive shielding layer 241 and the dielectric layer 252 are applied concurrently to the flexible circuit 250 by adhering materials such as those in the Tatsuta® PC series.

As shown in FIG. 5F, the traces 211, 212, 213 are shielded in 360 degrees. Each trace 211, 212, 213 is insulated in all directions from the conductive shielding material and the other traces 211, 212, 213. Dielectric layer 221 electrically insulates the top and sides of the traces 211 from the grounded plane 241, 212, 213, and the flexible substrate 202 electrically insulates the bottom of the traces 211, 212, 213 from the grounded plane 201. Accordingly, each trace 211, 212, 213 is surrounded by grounded shielding materials. Conductive layer 241 provides conductive shielding on the top and sides of the traces 211, 212, 213, and the bottom conductive layer 201 provides conductive shielding on the bottom of the traces 211, 212, 213.

V. "Three Copper Layer" Embodiments

Figure 7A:
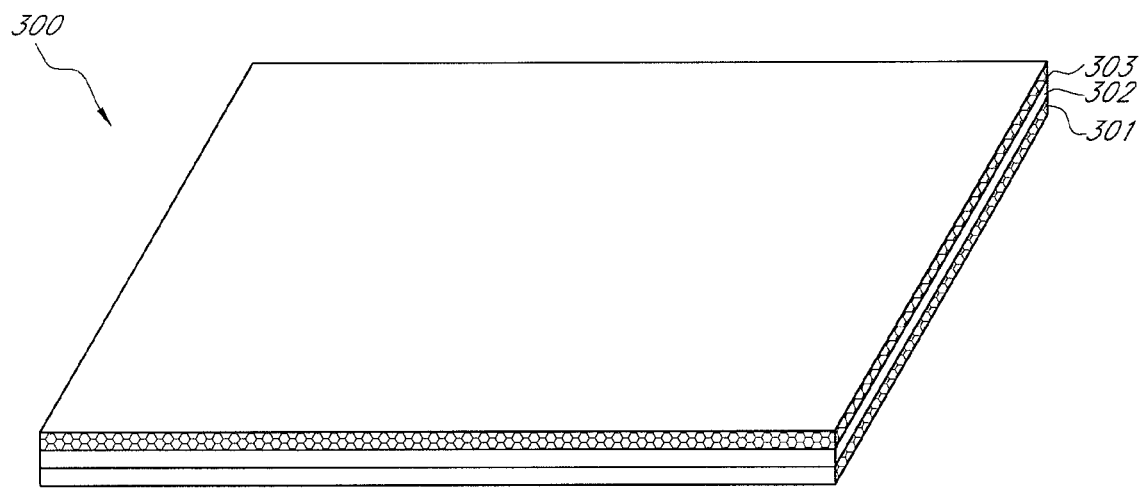
FIG. 7A is a top perspective view of one embodiment of a flexible circuit with two conductive layers.

FIG. 7G illustrates one embodiment of a three copper layer shielded flexible circuit. FIG. 8 illustrates a process diagram, including steps 801-808, for one embodiment of a method for manufacturing a shielded flexible circuit, and FIGS. 7A-G illustrate the structure of the shielded flexible circuit as each step of the method is practiced. As described herein, the figures associated with the structure of the circuit at each step of the method will be expressly referenced. In contrast, each step of the process diagram of FIG. 8 will be referred to using the reference numbers of FIG. 8 only.

In this embodiment, the method for manufacturing a shielded flexible circuit begins with the flexible support member 300 illustrated in FIG. 7A. The flexible support member 300 is comprised of three layers, a flexible substrate 302 sandwiched between a top conductive layer 303 and a bottom conductive layer 301. It is known to one with ordinary skill in the art that flexible support member 300 is commercially manufactured and readily available for purchase. In other embodiments, the method may begin by applying the top and bottom base conductive layer to the flexible substrate using plating, lamination, vapor deposition or other known techniques. In yet other embodiments, the top and bottom conductive layers may comprise any conductive material such as copper, silver, or gold.

Figure 7B:
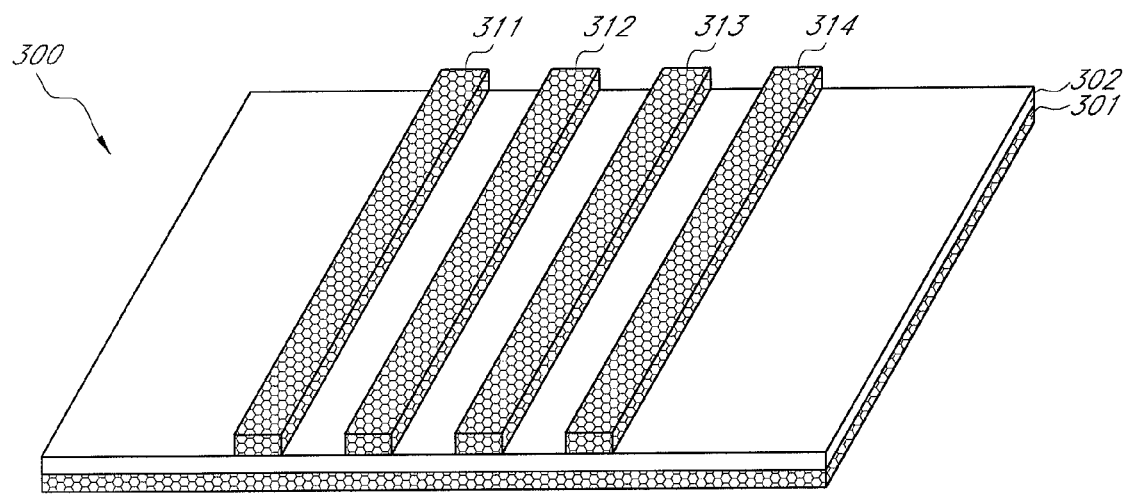
FIG. 7B is a top perspective view of the flexible circuit of FIG. 7A with etched traces.
Figure 8:
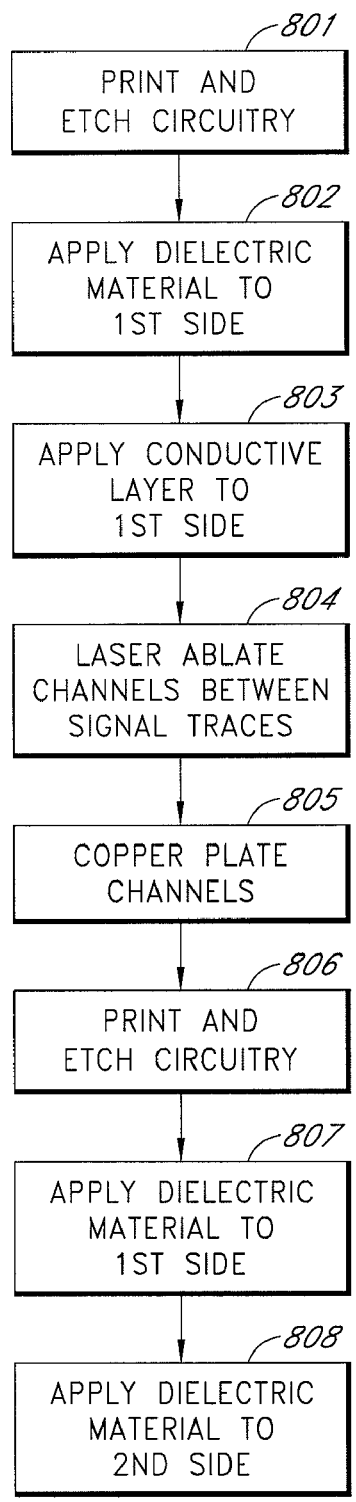
FIG. 8 is a process diagram illustrating one embodiment of the method for manufacturing the three copper layer shielded flexible circuit of FIG. 7G.

FIG. 7B depicts the traces 311, 312, 313, 314 used to carry electrical signals after they have been printed and etched in step 801. The traces 311, 312, 313, 314 are etched from the top conductive layer 303.

Figure 7C:
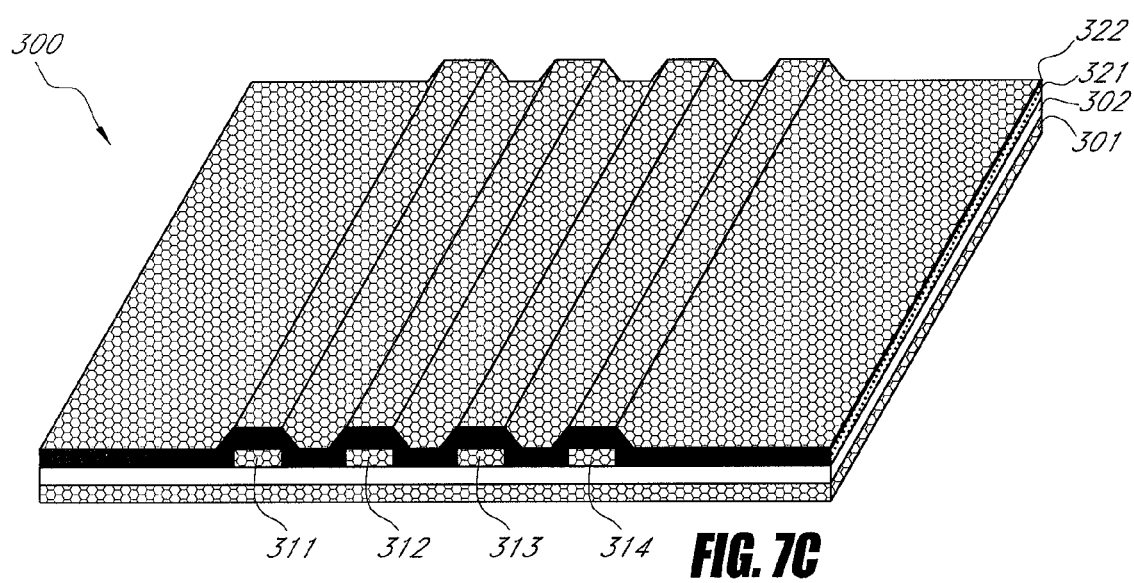
FIG. 7C is a top perspective view of the flexible circuit of FIG. 7B with a dielectric layer and a conductive shielding layer on a top side.

FIG. 7C depicts the flexible circuit 300 after steps 802 and 803 are complete. Step 802 requires applying a dielectric material 321 to the top side of the flexible circuit 300. The dielectric layer 322 may be comprised of any of the electrically insulative materials disclosed above and may be adhered to the flexible circuit using any of the techniques described above (for example, lamination). Step 803 requires applying a conductive shielding layer 322 on top of the dielectric layer 321. In one embodiment, the conductive shielding layer 322 is a copper foil. The copper foil is adhered to the flexible circuit 300 using lamination techniques or other techniques known in the art.

In other embodiments, steps 802 and 803 can be carried out simultaneously by using a material comprised of a conductive layer and a dielectric layer. The material is adhered to the flexible circuit 300 with the dielectric layer in physical contact with the traces 311, 312, 313, 314. In other embodiments, steps 802 and 803 can be carried out simultaneously by using a conductive material which adheres to the flexible circuit 300 via a dielectric adhesive. In these embodiments, where the conductive material is a copper foil, dielectric foil bonding adhesives such as ADH/PI/ADH may be used.

Figure 7D:
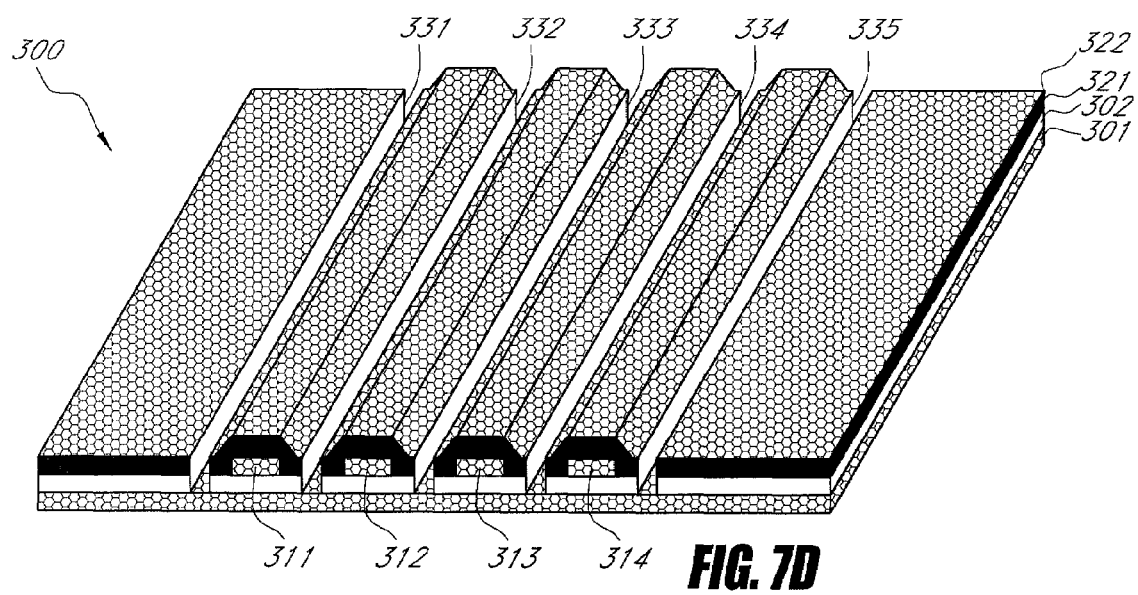
FIG. 7D is a top perspective view of the flexible circuit of FIG. 7C with channels between the etched traces

FIG. 7D illustrates channels 331, 332, 333, 334 formed between the traces 311, 312, 313, 314 by step 804. The channels 331, 332, 333, 334 are created by removing portions of the flexible substrate 302, the dielectric layer 321, and the conductive layer 322 located between the traces 311, 312, 313, 314. The channels 331, 332, 333, 334 are sufficiently deep so as to expose the bottom conductive layer 301. As stated above, techniques such as laser ablation may be employed to create the channels 331, 332, 333, 334.

Figure 7E:
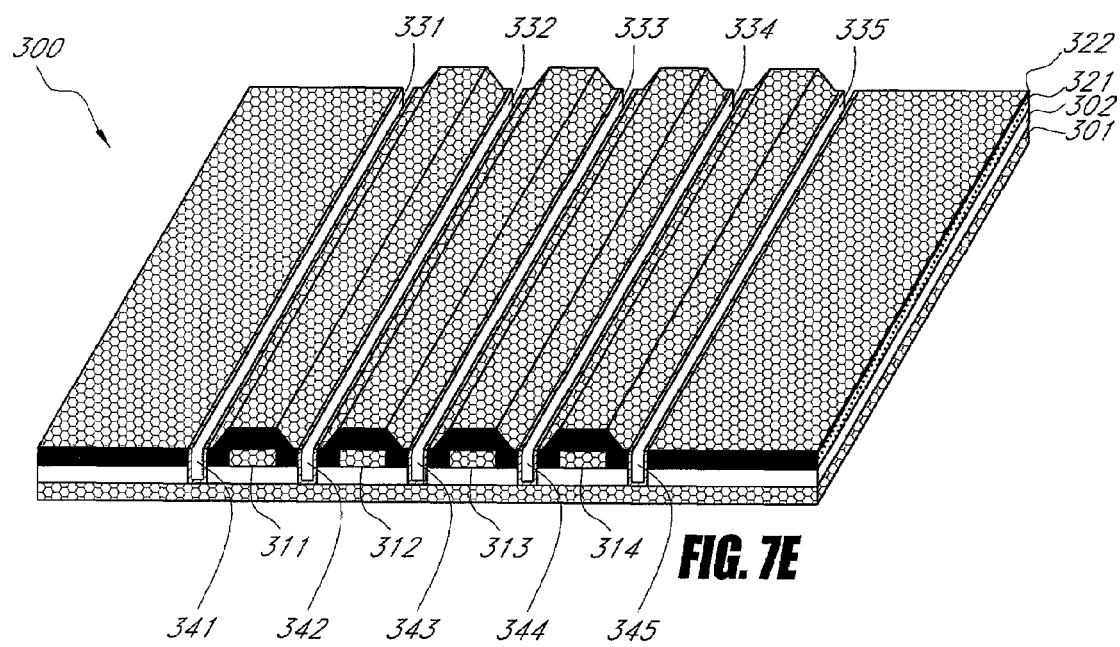
FIG. 7E is a top perspective view of the flexible circuit of FIG. 7D with plated channels.

FIG. 7E illustrates the copper plating 341, 342, 343, 344 applied to the channels 331, 332, 333, 334 in step 805. The copper plating provides an electrical connection between the conductive shielding layer 322 and the bottom conductive layer 301. To copper plate the channels 341, 342, 343, 344, conventional processes such as the SHADOW® process may be used. SHADOW® is a graphite based direct metallization process that facilitates the copper plating process.

In some embodiments, techniques and materials other than those used in copper plating are used to electrically connect the conductive shielding layer 322 and the bottom conductive layer 301. Such techniques and materials may include applying silver ink using screening techniques.

After an electrical connection between the conductive shielding layer 322 and the bottom conductive layer 301 has been formed, unwanted copper is removed from the flexible circuit 300 using commonly known techniques such as photolithography in step 806. For example, copper that was inadvertently plated on the top of conductive shielding layer 322 is removed in step 806.

Figure 7F:
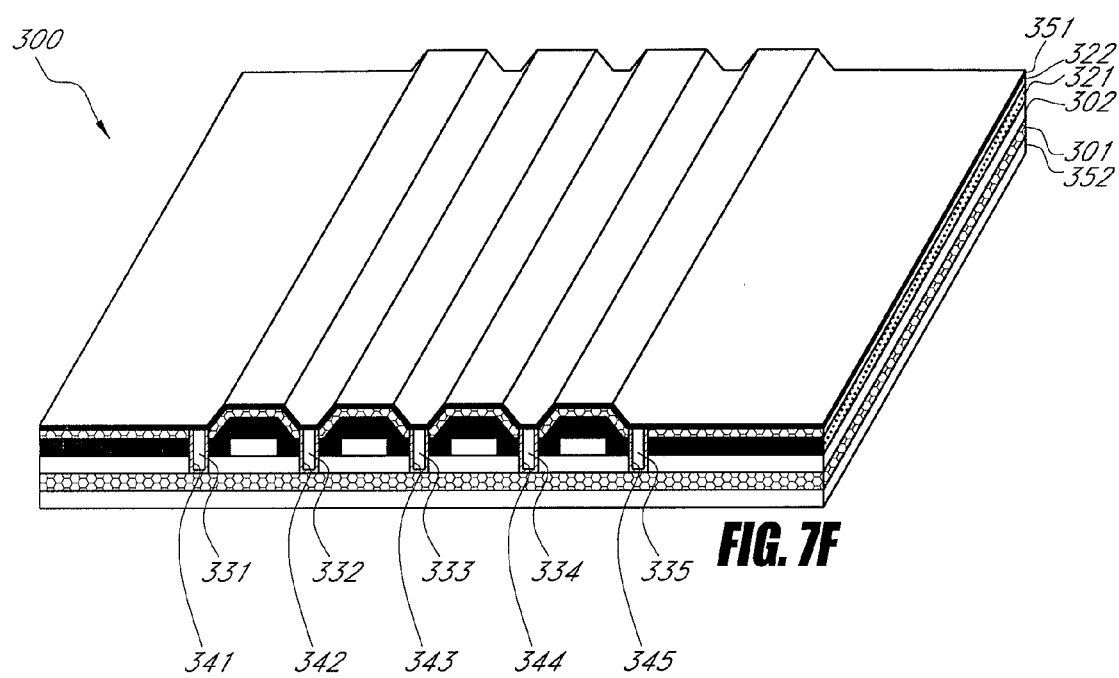
FIG. 7F is a top perspective view of the flexible circuit of FIG. 7E with a dielectric layer on the top side.

FIG. 7F illustrates a dielectric layer 351 applied to the top of the conductive shielding layer 322 and the plated channels 341, 342, 343, 344 in step 807. FIG. 7G illustrates a dielectric layer 352 applied to the bottom of the bottom conductive layer 301 in step 808. The dielectric layers 351, 352 may protect the flexible circuit 350 from external shorting. However, as noted above, some embodiments employ only one or no dielectric layers 351, 352.

As shown in FIG. 7G, the traces 311, 312, 313 are shielded in 360 degrees. Each trace 311, 312, 313 is insulated in all directions from the conductive shielding material and the other traces 311, 312, 313. Dielectric layer 321 electrically insulates the top and sides of the traces 311, 312, 313 from the grounded plane 322, 341, 342, 343, 344, and the flexible substrate 302 electrically insulates the bottom of the traces 311, 312, 313 from the grounded plane set. Accordingly, each trace 311, 312, 313 is surrounded by grounded shielding materials. Conductive layer 322 is the top grounded shielding material, and the bottom conductive layer 301 is the bottom shielding material. The plated channels 341, 342, 343, 344 shield the sides of the traces 311, 312, 313 and electrically connect conductive layer 322 and the bottom conductive layer 301.

VI. Application Example

Figure 9A:
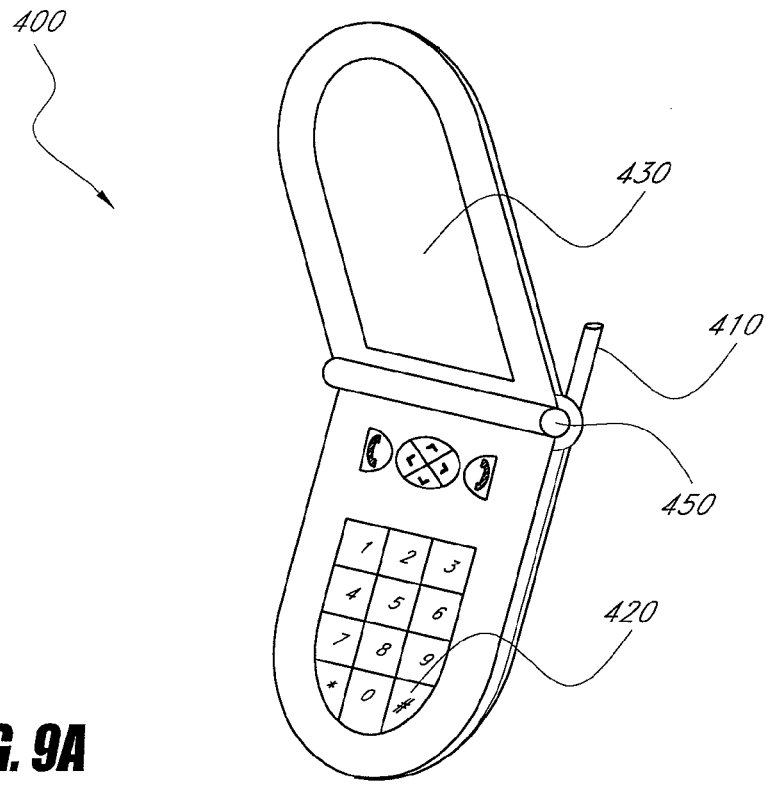
FIG. 9A illustrates one type of a mobile communication device with a hinge.

The apparatuses and methods for manufacturing the shielded flexible circuit disclosed herein may be employed, in one instance, in a flip phone. FIG. 9A depicts one type of flip phone 400. A typical flip phone 400 comprises a body 420, a screen 430, and an antenna 410. The body 420 is mechanically connected to the screen 430 via a hinge 450. The body 420 comprises circuitry which processes data transmitted and received by the antenna 410. Accordingly, images corresponding to the transmitted and received data are displayed on the screen 430.

Figure 9B:
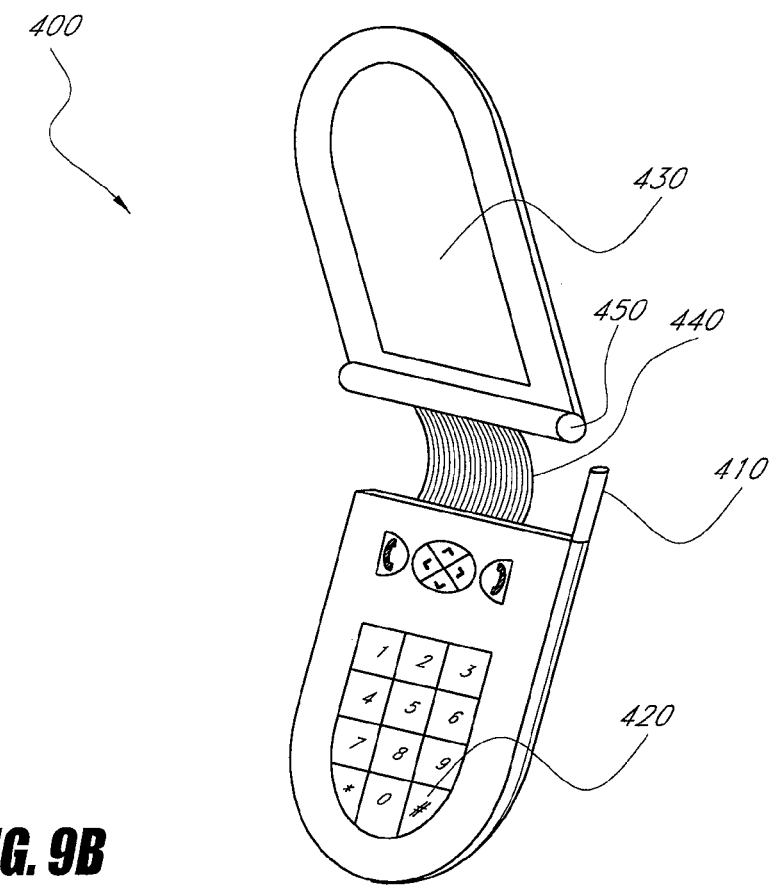
FIG. 9B illustrates a flexible circuit that provides electrical communication between the screen of the mobile communication device and the body of the mobile communication device.

FIG. 9B depicts the flip phone 400 after the body 420 has been physically separated from the screen 430. As shown, a shielded flexible circuit 440 according to the apparatuses and methods for manufacturing disclosed herein provides an electrical connection between the body 420 and the screen 430. The shielded flexible circuit 440 must be mechanically flexible along the hinge's 450 axis of rotation. Such flexibility is required in order for the flip phone 400 to open and close. Moreover, due to high data rate transfers required for applications such as streaming video, the traces on the shielded flexible circuit 440 must be capable of shielding each trace from EMI created by external sources and the other traces on the flexible circuit 440. Therefore, the shielded flexibly circuit 440 advantageously provides an electrical connection between the body 420 and the screen 430 in flip phone 400 applications.

By way of example only, one embodiment of the shielded flexible circuit 440 can accommodate data transmission rates between 2 to 4 GHz without substantial signal loss or distortion due to EMI. Furthermore, in this embodiment, the distance between the centers of proximate traces may be as small as 20 thousandths of an inch.

VII. Conclusion

The above presents a description of the best mode contemplated for the apparatuses and methods of manufacturing said shielded flexible circuit in such full, clear, and exact terms as to enable any person skilled in the art to which it pertains to produce these components and practice these methods. These apparatuses and methods are, however, susceptible to modifications that are fully equivalent to the embodiment discussed above. Consequently, these apparatuses and methods are not limited to the particular embodiments disclosed. On the contrary, these apparatuses and methods cover all modifications coming within the spirit and scope of the present invention.

What is claimed is:

1. A shielded flexible circuit having a plurality of shielded electrical conductors in close proximity to one another such that signals transmitted on one of said plurality of shielded electronic circuits do not substantially interfere with signals transmitted on the other of said plurality of electronic conductors comprising:
    a support member supporting a plurality of etched copper traces on a first side of said support member and a copper layer on a second side of said support member, at least some of said traces serving as said electrical conductors;
    said support member flexible along at least one axis;
    said plurality of etched copper conductors and said copper layer substantially as flexible as said support member;

an electrically insulative material in substantial proximity to each of said plurality of copper traces serving as electrical conductors so as to electrically insulate each of said electrical conductors;

a conductive shield over said electrical insulation material and surrounding a portion of each of said etched copper conductors along substantially the entire length of each of said plurality of copper traces;

said conductive shield in electrical communication with said copper layer via discontinuities in said support member, said conductive shield and said copper layer providing a substantially 360° electrical shield around each of said etched copper traces serving as electrical conductors;

said electrically insulative material physically located between said conductive shield and each of said plurality of copper traces serving as electrical conductors;

a first flexible dielectric layer covering substantially the entire exposed surface of said conductive shield; and a second flexible dielectric layer covering substantially the entire exposed surface of said copper layer to create a flexible assembly.

2. The shielded flexible circuit of claim 1, wherein said conductive shield includes:

alternate etched copper traces not serving as said electrical conductors; and discontinuities in the electrically insulated material over said alternate etched copper traces so that said conductive shield includes (i) said copper layer, (ii) respective traces located on each side of each trace serving as an electrical conductor, and (iii) conductive material in said discontinuates to provide a 360° conductive shield around each of said etched copper traces serving as electrical conductors.

3. The shielded flexible circuit of claim 1, wherein substantially all of said etched copper traces serve as said electrical conductors, said flexible circuit having interstices between each of said plurality of insulated copper traces, and said conductive shield includes (i) said copper layer, (ii) a layer of conductive material over said copper traces, and (iii) conductive material in said interstices.

4. The shielded flexible circuit of claim 3, wherein said interstices are channels.

5. The shielded flexible circuit of claim 4, wherein said channels are located in said support member.

6. The shielded flexible circuit of claim 1, wherein said support member is formed by a non-conductive flexible material.

7. The shielded flexible circuit of claim 1, wherein said flexible support member is a polyimide film.

8. The shielded flexible circuit of claim 1, wherein said conductor shield includes a silver based material.

9. A shielded flexible cable having a plurality of shielded electronic circuits in close proximity to one another such that signals transmitted on one of said plurality of shielded electronic circuits do not substantially interfere with signals transmitted on the other of said plurality of electronic circuits comprising:

a polyimide support member supporting a plurality of etched copper traces on a first side of said polyimide support member and a copper layer on a second side of said polyimide support member;

said polyimide support member flexible along at least one axis;

said plurality of etched copper traces and said copper layer substantially as flexible as said polyimide support member;

a silver based material, including, for example, silver ink or silver film, surrounding a portion of each of said plurality of copper traces along substantially the entire length of each of said plurality of copper traces;

said silver based material in electrical communication with (i) said copper layer via discontinuities in said support member, and (ii) a grounded terminal;

an electrically insulative material in substantial proximity to each of said plurality of copper traces so as to electrically insulate each of said plurality of copper traces from (i) the other said plurality of copper traces, and (ii) said silver based material;

said electrically insulative material physically located between said silver based material and each of said plurality of copper traces;

a first flexible dielectric layer covering substantially the entire exposed surface of said silver based material; and a second flexible dielectric layer covering substantially the entire exposed surface of said copper layer.

10. A shielded flexible cable having a plurality of flexible conductors with each conductor having a flexible conductive shield substantially surrounding each said conductor along substantially the entire length of each conductor comprising:

a flexible sheet of dielectric material supporting a metallic conductive layer, said sheet and metallic layer having a sufficient length and width to support all of said flexible conductors;

a plurality of separated non-conductive flexible films attached to said metallic conductive layer;

said flexible conductors respectively supporting on said flexible films;

a plurality of separated dielectric members respectively covering the exposed portion of said flexible conductors so that said dielectric members and said non-conductive films completely electrically insulate each of said flexible conductors;

a flexible conductive material (i) filling the interstices between each of said insulated conductors, and (ii) in direct electrical contact with said metallic conductive layer so that each of said plurality of conductors is substantially surrounded along its entire length by an electrically conductive shield formed by said conductive material and said metallic conductive layer; and a first flexible insulative layer covering substantially the entire exposed surface of said conductive material, and a second flexible insulative layer covering substantially the entire exposed surface of said metallic layer to create a flexible assembly.

11. A flexible cable for connecting a signal receiving portion and a display portion of a cellular telephone across a mechanical hinge comprising:

a plurality of conductors that are in electrical communication with (i) said receiving portion at a first terminal region of said plurality of conductors and (ii) said display portion at a second terminal region of said plurality of conductors;

a flexible non-conductive substrate supporting said plurality of conductors on a first side of said substrate and a conductive layer on a second side of said substrate;

a conductive material surrounding a portion of each of said plurality of conductors along substantially the entire length of each of said plurality of conductors;

said conductive material in electrical communication with said conductive layer via discontinuities in said flexible non-conductive substrate;
a non-conductive material substantially surrounding a portion of each of said plurality of conductors along substantially the entire length of each of said plurality of conductors;
said non-conductive material electrically insulating each of said plurality of conductors from said conductive layer;
a first flexible layer covering substantially the entire exposed surface of said conductive layer; and
a second flexible layer covering substantially the entire exposed surface of said conductive material.

12. An shielded flexible circuit, comprising:
a flexible support member;
a first conductor, a second conductor, and a third conductor in contact with a first side of said flexible support member;
said second conductor located between said first and third conductors and electrically insulated from said first and third conductors;
first non-conductive layer in contact with a first side of said flexible support member, said first non-conductive layer in contact with said first conductor;
a first conductive layer in contact with said first non-conductive layer, said first conductive layer in communication with said first and third conductors;
a second conductive layer in contact with a second side of said flexible support member, said second conductive layer in communication with said first and third conductors and electrically insulated from said second conductor; and
wherein the shielded flexible circuit does not substantially include a dielectric layer on exposed surfaces of said first conductive layer and said second conductive layer.

13. A shielded flexible circuit, comprising:
a flexible support member;
a conductor in contact with a first side of said flexible support member;
a first non-conductive layer in contact with said conductor;
said first non-conductive layer in contact with said flexible member and said conductor;
a first conductive layer in contact with said first non-conductive layer;
a second conductive layer in contact with a second side of said flexible support member, said second conductive layer in communication with said first conductive layer and electrically insulated from said conductor;
a first flexible layer covering substantially the entire exposed surface of said first conductive layer; and
wherein the shielded flexible circuit does not substantially include a dielectric layer on exposed surface of said second conductive layer to create a flexible assembly.

14. The shielded flexible circuit of claim 13, wherein said flexible support member comprises channels, said channels permitting said first and second conductive layers to be in communication with the other.

15. A shielded flexible circuit, comprising:
a flexible support member;
a conductor in contact with a first side of said flexible support member;
a first non-conductive layer in contact with said conductor, said first non-conductive layer in contact with said flexible support member and said conductor;
a first conductive layer in contact with said first non-conductive layer;
a second conductive layer in contact with a second side of said flexible support member;
a third conductive layer in communication with said first and second conductive layers and electrically insulated from said conductor;
a first flexible layer covering substantially the entire exposed surface of said second conductive layer; and
wherein the shielded flexible circuit does not substantially include a dielectric layer on exposed surface of said first conductive layer to create a flexible assembly.

16. The shielded flexible circuit of claim 12, wherein said flexible support member includes channels, conductive material in said channels enabling said first, second, and third conductive layers to be in electrical communication with one another.

17. A shielded flexible circuit, comprising:
a flexible support member;
a first conductor and a second conductor in contact with said flexible support member;
said first and second conductors electrically insulated from the other;
a first conductive material co-axially disposed around said first conductor, said first conductive material electrically insulated from said first conductor;
a second conductive material co-axially disposed around said second conductor, said second conductive material electrically insulated from said second conductor;
a first flexible layer covering substantially the entire exposed surface of said first conductive material; and
a second flexible layer covering substantially the entire exposed surface of said second conductive material.

18. The shielded flexible circuit of claim 17, wherein the first and second conductors are capable of transmitting data at rates greater than or equal to 2 gigahertz.

19. The shielded flexible circuit of claim 17, wherein the distance from the center of the first conductor and the center of the second conductor is less than or equal to 20 thousandths of an inch.

20. A method of forming a shielded flexible circuit, the method comprising:
forming a first conductor, a second conductor and a third conductor from a conductive material adhered to a first side of a flexible support member, said second conductor located between said first and third conductors and electrically insulated from said first and third conductors;
adhering a first non-conductive layer to the first side of said flexible support member, said first non-conductive layer in contact with said first conductor;
adhering a first conductive layer to said first non-conductive layer, said first conductive layer in communication with said first and third conductors;
adhering a second conductive layer to a second side of said flexible support member, said second conductive layer in communication with said first and third conductors and electrically insulated from said second conductor;
forming a first flexible layer covering substantially the entire exposed surface of said first conductive layer; and
forming a second flexible layer covering substantially the entire exposed surface of said second conductive layer to create a flexible assembly.

21. The method of claim 20, wherein forming said first, second, and third conductors comprises etching a copper trace.

22. The method of claim 20, wherein said flexible support member is a polyimide film.

23. The method of claim 20, wherein said first and third conductors are electrically grounded.

24. The method of claim 20, wherein said first conductive layer is a silver based material.

25. The method of claim 20, wherein said first conductive layer comprises a conductive portion and a non-conductive portion.

26. The method of claim 20, wherein said second conductive layer is a silver based material.

27. The method of claim 20, wherein said second conductive layer comprises a conductive portion and a non-conductive portion.

28. The method of claim 20, comprising forming channels in said flexible support member, said channels permitting said first and third conductors and said first and second conductive layers to be in communication with one another.

29. A method of forming a shielded flexible circuit, the method comprising:
  forming a conductor from a conductive material adhered to a first side of a flexible support member, said flexible member comprising a second side adhered to a first conductive layer;
  adhering a first non-conductive layer to said conductor and said flexible member;
  adhering a second conductive layer to said first non-conductive layer, said second conductive layer in communication with said first conductive layer and electrically insulated from said conductor; and
  wherein a dielectric layer is not formed on exposed surfaces of said first conductive layer and said second conductive layer to create a flexible assembly.

30. A method of forming a shielded flexible circuit, the method comprising:
  forming a conductor from a conductive material adhered to a first side of a flexible support member, said flexible member comprising a second side adhered to a first conductive layer;
  adhering a first non-conductive layer to said conductor and said flexible support member;
  adhering a second conductive layer to said first non-conductive layer;
  depositing a third conductive layer, said third conductive layer in communication with said first and second conductive layers and electrically insulated from said conductor;
  forming a first flexible layer covering substantially the entire exposed surface of said first conductive layer; and
  forming a second flexible layer covering substantially the entire exposed surface of said second conductive layer.

31. A method of forming a shielded flexible circuit, the method comprising:
  forming a first conductor and a second conductor from a first conductive material adhered to a first side of a flexible support member, said first and second conductors electrically insulated from one another;
  forming a second conductive material co-axially disposed around said first conductor, said second conductive material electrically insulated from said first conductor;
  forming a third conductive material co-axially disposed around said second conductor, said third conductive material electrically insulated from said second conductor;
  forming a first flexible layer covering substantially the entire exposed surface of said second conductive material; and
  forming a second flexible layer covering substantially the entire exposed surface of said third conductive material.

32. The method of claim 31, wherein forming said first and second conductors comprises etching copper traces.

33. The method of claim 31, wherein said flexible support member is a polyimide film.

34. The method of claim 31, further comprising adhering a first and second non-conductive layers co-axially disposed between said first conductive material and said first conductor and said second conductive material and said second conductor, respectively.

35. The method of claim 31, wherein said second and third conductive materials are in communication with one another.

36. The method of claim 31, wherein said second and third conductive materials are a silver based material.

37. The method of claim 31, wherein the first and second conductors are capable of transmitting data at rates greater than or equal to 2 gigahertz.

38. The method of claim 31, wherein the distance from the center of the first conductor and the center of the second conductor is less than or equal to 20 thousandths of an inch.

* * * * *